US006927088B2

(12) United States Patent
Katayama

(10) Patent No.: US 6,927,088 B2
(45) Date of Patent: Aug. 9, 2005

(54) ELECTROOPTICAL SUBSTRATE DEVICE AND MANUFACTURING METHOD FOR SAME, ELECTROOPTICAL APPARATUS, ELECTRONIC APPARATUS AND MANUFACTURING METHOD FOR A SUBSTRATE DEVICE

(75) Inventor: Shigenori Katayama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/394,027

(22) Filed: Mar. 24, 2003

(65) Prior Publication Data

US 2003/0180979 A1 Sep. 25, 2003

Related U.S. Application Data

(62) Division of application No. 10/101,012, filed on Mar. 20, 2002, now Pat. No. 6,605,827.

(30) Foreign Application Priority Data

Mar. 23, 2001 (JP) ........................................ 2001-085750
Jan. 23, 2002 (JP) ........................................ 2002-014607

(51) Int. Cl.⁷ .......................... H01L 21/00; H01L 21/84
(52) U.S. Cl. .......................... 438/30; 438/149; 438/164; 438/525
(58) Field of Search .......................... 438/30, 149, 164, 438/525, 640

(56) References Cited

U.S. PATENT DOCUMENTS

| | | | | | |
|---|---|---|---|---|---|
| 5,156,985 | A | * | 10/1992 | Yamada et al. | 438/144 |
| 5,177,030 | A | * | 1/1993 | Lee et al. | 438/385 |
| 5,334,862 | A | * | 8/1994 | Manning et al. | 257/67 |
| 5,854,494 | A | | 12/1998 | Yamazaki et al. | |
| 5,889,291 | A | | 3/1999 | Koyama | |
| 5,976,960 | A | * | 11/1999 | Cheffings | 438/525 |
| 6,066,860 | A | | 5/2000 | Katayama et al. | |
| 6,117,785 | A | * | 9/2000 | Lee et al. | 438/700 |
| 6,191,435 | B1 | | 2/2001 | Inoue | |
| 6,329,284 | B2 | * | 12/2001 | Maekawa | 438/637 |
| 6,335,772 | B1 | | 1/2002 | Sato et al. | |
| 6,344,885 | B1 | | 2/2002 | Mori et al. | |

FOREIGN PATENT DOCUMENTS

JP A 5-113581 5/1993
KR 1995-33582 12/1995

* cited by examiner

Primary Examiner—Michael Trinh
(74) Attorney, Agent, or Firm—Oliff & Berridge, PLC

(57) ABSTRACT

An electrooptical substrate device has pixel electrodes and pixel-switching TFTs connected thereto, on a substrate. The TFT is a P-channel TFT of an SOI structure that does not have a body contact. Due to this, a transistor is architected in each pixel that is suited to broaden the opening area in each pixel, and having comparatively high performance, thereby enabling bright, high-quality image display.

3 Claims, 12 Drawing Sheets

ELECTROOPTICAL SUBSTRATE DEVICE AND MANUFACTURING METHOD FOR SAME, ELECTROOPTICAL APPARATUS, ELECTRONIC APPARATUS AND MANUFACTURING METHOD FOR A SUBSTRATE DEVICE

This is a division of application Ser. No. 10/101,012 filed Mar. 20, 2002 now U.S. Pat. No. 6,605,827, which claims the benefit of JP 2001-085750 and JP 2002-014607. The entire disclosure of the prior applications is hereby incorporated by reference in its entirety.

BACKGROUND OF THE INVENTION

1. Field of Invention

The present invention relates to an electrooptical substrate device for an electrooptical apparatus, such as a liquid-crystal apparatus, of a so-called TFT active-matrix drive scheme for active-matrix-driving pixel electrodes by thin film transistors (hereinafter "TFTs"). The invention also relates to a manufacturing method for the same, an electrooptical apparatus including such an electrooptical substrate device, an electronic apparatus having such an electrooptical apparatus, and a manufacturing method for a substrate device.

2. Description of Related Art

In this type of an electrooptical substrate device, pixel-electrode-switching TFTs are respectively provided on a plurality of pixel electrodes that are arranged in a matrix form. Each TFT is turned on each time a scanning signal is applied to the gate electrode thereof, to write an image signal onto the pixel electrode through the TFT.

Particularly, N-channel TFTs, having as carriers high-mobility electrons, are used to enable control by the TFTs having a high-performance transistor characteristic when effecting pixel-switching control. Recently, as the drive frequency of an electrooptical apparatus increases, the N-channel TFTs having high-mobility electrons as carriers are still being used in order to cope with the higher driving frequency.

On the other hand, in order to perform a higher level of driving, such as high-frequency driving, there is a need to further enhance the performance of such a pixel-switching TFT. For this reason, it is proposed to apply the SOI (Silicon On Insulator) structure, or SOI art, in the semiconductor manufacturing technology to an electrooptical substrate device of that kind. Specifically, a single-crystal semiconductor layer is formed by bonding or the like on an insulating layer of quartz or sapphire formed on a substrate, to fabricate transistors on the single-crystal semiconductor layer. The application of such an SOI art makes it possible to fabricate single-crystal silicon TFTs that are higher in performance than the amorphous-silicon or polysilicon TFTs on an electrooptical substrate device.

SUMMARY OF THE INVENTION

However, where an SOI structure is adopted, the N-channel MOS TFT has a tendency to build up holes as surplus carriers in the channel region during the operation thereof. According to the research by the present inventor, this is due to a parasitic bipolar phenomenon resulting from a substrate float effect, because in the SOI structure, an insulator layer is arranged below the channel region. In this phenomenon, in the case of the N-channel MOS TFT, the electrons, of among the electron-hole pairs caused due to impact ionization within a drain depletion layer, directly flow into the drain. However, the holes are built up, as surplus carriers, in the vicinity of the source beneath the channel, to raise the channel potential and further promote impact ionization. As a result, the accumulation amount of surplus holes increases to increase the drain current in an avalanche-effect fashion.

Accordingly, in the n-channel MOS TFT adopting an SOI structure, a need exists to provide a body contact to remove such surplus carriers. More specifically, a portion of a semiconductor layer needs to be extended from the channel region in order to remove surplus carriers, and to place a surplus-carrier-removing conductor layer in contact with that extended portion. This causes a problem of complication in the overlying structure on a substrate and in the manufacturing process. Furthermore, such a body contact makes it difficult to fabricate TFTs within a limited region of non-opening area in each pixel not contributing to actual display in the image display region. There is also a problem of interference with the broadening of the opening area of each pixel.

The present invention addresses the foregoing problem, and provides each pixel with comparatively high performance transistors suited to broaden the opening area in each pixel, and provides an electrooptical substrate device enabling bright, high-quality image display, a manufacturing method for the same, an electrooptical apparatus including such an electrooptical substrate device, an electronic apparatus having such an electrooptical apparatus, and a manufacturing method for a substrate device to be suitably used in such an electrooptical apparatus.

An electrooptical substrate device of the invention that addresses the foregoing problem includes: on a substrate, an insulator layer; and an N-type single-crystal semiconductor layer formed on the insulator layer, and including a P-type source region, a P-type drain region and a channel region; a gate electrode formed on the single-crystal semiconductor layer in the channel region through a gate insulating film; a scanning line connected to the gate electrode; a data line connected to one of the source region and the drain region; and a pixel electrode connected to the other of the source region and the drain region. A P-channel transistor is architected by the single-crystal semiconductor layer, the gate insulating film and the gate electrode to switch-control the pixel electrode.

The use of the electrooptical substrate device of the invention makes it possible to architect an electrooptical apparatus that is capable of being active-matrix-driven by switch-controlling the pixel electrodes due to the transistors connected to the scanning and data lines. In the electrooptical substrate device of the invention, particularly an N-type single-crystal semiconductor layer is formed on an insulator layer, to architect P-channel transistors on a so-called SOI substrate. The P-channel transistor, having holes as carriers, is generally inferior in transistor performance to the N-channel transistor correspondingly to its low mobility. However, because of being formed on an SOI substrate, it is made to be not inferior in its transistor performance to the MOS transistor configured using, for example, polysilicon or amorphous silicon as a semiconductor layer. Namely, the P-channel transistor on the SOI substrate provides sufficiently high transistor performance to switch-control the pixel electrode. Conversely, despite being formed on the SOI substrate, because it is of the P-channel type, the parasitic bipolar effect due to a substrate float effect as noted before is practically not a problem, which is different from the case with the N-channel type. This is considered to be because the P-channel transistor is low in the impact ionization ratio of holes. For this reason, there is no need for the P-channel transistor to perform the removal of surplus carriers required in practical use in the N-channel transistor as noted before. Consequently, a structure does not need to be fabricated to remove such surplus carriers in each pixel, correspondingly enabling an increase in the opening ratio in each pixel. At the same time, there is no complication incurred in the overlying structure of each pixel and in the manufacturing process. This ultimately results in realizing an electrooptical substrate device that is capable of being switch-controlled or active-matrix-driven by the transistors having comparatively high performance to display a bright, high-quality image.

In one form of an electrooptical substrate device of the invention, the transistor is a P-channel MOS (Metal Oxide Silicon) transistor.

In this form, because the P-channel MOS transistor is provided on the substrate, a conductor layer does not have to be provided to remove the carriers built up in the semiconductor layer during operation, which is different from the N-channel MOS transistor. Because the P-channel transistor is a transistor made up on the SOI substrate, sufficiently high transistor performance is obtained in switch-controlling the pixel electrode.

Another form of an electrooptical substrate device of the invention further includes an interlayer insulating film formed on the gate electrode, a source electrode formed by a P-type conductor layer on the interlayer insulating film and connected to the source region, and a drain electrode formed by a P-type conductor layer on the interlayer insulating film and connected to the drain region. The data line is connected to one of the source region and the drain region by way of one of the source electrode and the drain electrode, the pixel electrode being connected to the other of the source region and the drain region by way of the other of the source electrode and the drain electrode.

In accordance with this form, because the P-type source region is connected with a source electrode formed by a P-type conductor layer, a favorable electrical connection is obtained between the two. If a source electrode formed by an N-type conductor layer is connected, a PN junction is formed between the two, and hence favorable electrical connection is not to be expected. On the other hand, because the P-type drain region is connected with a drain electrode formed by a P-type conductor layer, favorable electrical connection is obtained between the two.

In this form, the P-type conductor layer may be doped to a P-type by ion implantation after depositing a conductor layer.

In accordance with this structure, electrical connection can be favorably provided between the conductor layer doped in P-type by ion implantation and the P-type source or drain region.

Otherwise, in this form, the source electrode may be connected to the source region through a contact hole opened in the interlayer insulating film and the gate insulating film, the drain electrode being connected to the drain region through a contact hole opened in the interlayer insulating film and the gate insulating film.

In accordance with this structure, electrical connection can be favorably provided between the source electrode formed by the P-type conductor layer and the P-type source region through the contact hole, while electrical connection is favorably provided between the drain electrode formed by the P-type conductor layer and the P-type drain region through the contact hole.

Another form of an electrooptical substrate device of the invention further includes a lower shadow film covering the channel region at an under side thereof, the insulator layer being formed on the lower shadow film.

In accordance with this form, the channel region is covered at an under side by the lower shadow film. Consequently, the channel region can be shadowed from the reflection light upon a back surface of the substrate, or from the return light, such as the light shining from another light bulb of a plural-plate-type projector using a plurality of light bulbs, including the electrooptical substrate devices, and streaming through a combination optical system. As a result, it is possible to effectively reduce or prevent occurrence of light leak current due to a photoelectric effect resulting from return light in the channel region.

In another form of an electrooptical substrate device of the invention, a CMP process is performed on a surface of the insulator layer at a side facing the single-crystal semiconductor layer.

In accordance with this form, because a CMP process is performed over the surface of the insulator layer, the single-crystal semiconductor layer can be bonded onto the surface of the insulator layer. Particularly, in the case of forming a lower shadow film, such an SOI structure is obtained without problem by thus performing a CMP process on the insulator layer.

In another form of an electrooptical substrate device of the invention, the substrate is formed of quartz glass.

In accordance with this form, an SOI structure is obtained that is architected with a P-channel transistor on the quartz glass.

In another form of an electrooptical substrate device of the invention, the substrate is formed of glass.

In accordance with this form, an SOI structure is architected with P-channel transistors on the glass.

In another form of an electrooptical substrate device of the invention, the pixel electrode is formed by a transparent electrode.

In accordance with this form, the electrooptical substrate device is used to realize a transmission-type electrooptical apparatus that light transmits through a transparent electrode, or a reflection-type electrooptical apparatus that light reflects through a transparent electrode.

In another form of an electrooptical substrate device of the invention, the pixel electrode is formed by a reflecting electrode.

According to this form, the electrooptical substrate device is used to realize a reflection-type electrooptical apparatus that light reflects upon a reflecting electrode.

Another form of an electrooptical substrate device of the invention further includes a peripheral circuit, on the substrate, in a periphery of an image display region, in which the pixel electrode is formed. The peripheral circuit includes an N-channel transistor, the N-channel transistor having a conductor layer to suck out carriers built up in the semiconductor layer thereof. The P-channel transistor provided in the image display region does not have a conductor layer to suck out carriers built up in the semiconductor layer thereof.

In accordance with this form, the peripheral circuits, such as the scanning-line drive circuit and the data-line drive circuit, are configured at least in part with high-performance N-channel transistors. Particularly, the peripheral region has enough area to fabricate circuits in an amount corresponding to the lack of need to secure an opening area, as compared to the image display region where a pixel opening area needs to be secured. Accordingly, the problem is comparatively small if the N-channel transistor, constituting a peripheral circuit, is provided with a conductor layer to suck out the built-up surplus carriers. Conversely, the use of a peripheral circuit, including a high-performance N-channel transistor provided with a conductor layer to suck out such surplus carriers, enables a high level of driving or control. On the other hand, the P-channel transistor in the image display region, not requiring the provision of a conductor layer to suck out built-up surplus carriers, can have a broadened opening area in each pixel. These structures ultimately result in the capability of image display with brightness and high quality.

Another form of an electrooptical substrate device of the invention further includes, on the substrate, an intermediate conductor layer interlevel-connecting the other of the source region and the drain region and the pixel electrode, and including a pixel-potential capacitance electrode, and a capacitance line including a fixed-potential capacitance electrode arranged oppositely to the pixel-potential capacitance electrode through a dielectric film. A storage capacitance is architected by the pixel-potential capacitance electrode and the fixed-potential capacitance electrode, and connected to the pixel electrode. At least one of the capacitance line and the intermediate conductor layer is formed by a conductive shadow film and includes a portion covering the channel region on the substrate from above.

In accordance with this form, interlevel connection is provided between the pixel electrode and the other of the source and drain regions by an intermediate conductor layer. Consequently, even if the interlayer distance is long between the two, the two can be favorably electrically connected, while avoiding the technical difficulty in connecting the two through a long-distance contact hole or the like. Furthermore, the intermediate conductor layer, having a function of such interlevel connection, also serves as a pixel-potential capacitance electrode of a storage capacitance. Consequently, the overlying structure and the manufacturing process can be simplified as compared to the case of separately forming the interlevel-connecting conductor layer and the conductor layer for the pixel-potential capacitance electrode. In addition, because at least one of the intermediate conductor layer and the capacitance line, both of which architecting a storage capacitance, is formed by a conductive shadow film covering the channel region from above, the channel region can be shadowed against the incident light from above. This can effectively reduce or prevent occurrence of light leak current due to a photoelectric effect resulting from the incident light in the channel region. Moreover, the overlying structure and the manufacturing process can be simplified as compared to the case of separately forming such a shadow film.

Incidentally, an island-formed interlevel-connecting conductor layer, of the same film as the intermediate conductor layer, may be provided between the data line and one of the source and drain regions. Meanwhile, in this form, a lower shadow film noted above, if provided, can shadow the channel region at its upper and lower sides, thus providing a further advantage.

In this form, the storage capacitance is provided at least in a part of a region overlapped with the scanning line as viewed in plan.

In accordance with this structure, because a storage capacitance can be fabricated, even in a region overlapped with the scanning line, storage capacitance can be increased without narrowing the opening area in each pixel.

Otherwise, in this form, the storage capacitance may be provided at least in a part of a region overlapped with the data line as viewed in plan.

In accordance with this structure, because a storage capacitance can be fabricated, even in a region overlapped with the data line, storage capacitance can be increased without narrowing the opening area in each pixel.

An electrooptical apparatus of the invention that addresses the foregoing problem includes various forms of the electrooptical substrate device as described above; a counter substrate arranged opposite to the electrooptical substrate device; and an electrooptical substance sandwiched between the counter substrate and the electrooptical substrate device.

Because the electrooptical apparatus is structured having the foregoing electrooptical substrate device, it can display a bright, high-quality image.

An electronic apparatus of the invention that addresses the foregoing problem includes an electrooptical apparatus as described above.

Because the electronic apparatus of the invention has the above electrooptical apparatus, various kinds of electronic apparatus are realized that are capable of displaying a bright, high-quality image, e.g., a projector, a display apparatus built in an OA appliance, and a display apparatus of a cellular phone.

A method for manufacturing an electrooptical substrate device of the invention that addresses the foregoing problem manufactures a form having a contact hole in the foregoing electrooptical substrate device of the invention, and includes: a first depositing step for forming the interlayer insulating film on the single-crystal semiconductor layer; an opening step for opening the contact hole in the interlayer insulating film and the gate insulating film; a second depositing step for forming a material film of a predetermined kind to be formed into the P-type conductor layer, on the interlayer insulating film and the gate insulating film in which the contact hole is opened; and an ion-implant step for implanting ions to the formed material film to thereby form the P-type conductor. In the ion-implant step, ions are implanted with an inclination by a predetermined angle X with respect to a centerline of the contact hole, such that ions are implanted to a region of the material film formed on a side surface of the contact hole, and the predetermined angle X is set within a range to implant ions to a region of the material film formed on a bottom surface of the contact hole.

In accordance with the method for manufacturing an electrooptical substrate device of the invention, while forming a P-type conductor layer that forms a source electrode or drain electrode on the interlayer insulating film and the gate insulating film in which a contact hole is opened, a material film of a predetermined kind of, e.g., polysilicon, to be formed into a P-type conductor layer, is first formed by a CVD (chemical vapor deposition) process or the like. Thereafter, ions, e.g., B (boron), are implanted to the formed material film, thereby forming a P-type conductor layer.

Particularly the contact hole at its side surface is sharply vertical over the substrate. Consequently, even if ions are implanted along a centerline of the contact hole, i.e., along the side surface of the contact hole in the ion implant process, it is for practical purposes almost or entirely impossible to implant ions to a material film region formed on the side surface. Nevertheless, if ions are implanted in a direction that is greatly inclined from the centerline of the contact hole, it will be, for practical purposes, almost or entirely impossible to implant ions to a material film region formed on a bottom surface in the contact hole. This is because the contact hole at its edge and peripheral portion prevents an ion path directed with inclination toward the bottom surface of the contact hole. In any case, it is difficult or impossible to reduce, without unevenness, the resistance of the material film at the inside of the contact hole. This makes it difficult to realize a favorable electrical connection by a P-type conductor layer between the pixel electrode or data line and the source or drain region.

In contrast, the invention implants ions with inclination at a predetermined angle X with respect to the contact-hole centerline in the ion implant process, and ions are implanted to the material film region formed on the side surface of the contact hole. At the same time, because the predetermined angle X is set within a range to implant ions to the material film region formed on the bottom surface of the contact hole, ions can also be implanted to the material film region that is formed on the bottom surface of the contact hole. Consequently, the material film inside the contact hole can be comparatively easily reduced in resistance. It is possible to realize a favorable electrical connection by a P-type conductor layer between the pixel electrode or data line and the source or drain region. This can ultimately enhance the quality in the display image.

As described above, the form having a contact hole in the foregoing electrooptical substrate device of the invention can be comparatively easily manufactured by the use of an ion implant process.

In one form of a method for manufacturing an electrooptical substrate device of the invention, in the ion implant step, ions are implanted in a plurality of directions at a different timing or simultaneously with an inclination by a predetermined angle X with respect to a centerline of the contact hole. The predetermined angle X is set, in each of the plurality of directions, within a range to implant ions to the region of the material film positioned at a center of the bottom surface of the contact hole.

In accordance with this form, ions are implanted with inclination in four directions at a different timing or simultaneously in the ion implant process. Concerning each region in the bottom surface of the contact hole, particularly the ion path directed to a different region depending on an inclination direction is hindered by the edge and peripheral portion of the contact hole, and the ion path directed to a different region depending on an inclination direction is not hindered by the edge and peripheral portion of the contact hole. Moreover, also concerning each region in the side surface of the contact hole, the ion path directed to a different region depending on an inclination direction is hindered by the edge and peripheral portion of the contact hole, and the ion path directed to a different region depending on an inclination direction is not hindered by the edge and peripheral portion of the contact hole. Accordingly, by changing the inclination direction of ion implantation, the region to which ions are to be implanted can be changed for each region of the bottom surface of the contact hole. For this reason, by properly changing the inclination direction, e.g., in three directions, in four directions, in eight directions, or in every direction surrounding the center of the contact hole, the region in the bottom surface of the contact hole to which ions are to be implanted can be all or almost all of the region of the bottom surface. At the same time, also concerning the side surface of the contact hole, the region to which ions are to be implanted can be all or almost all the region thereof. Consequently, the material film inside of the contact hole can be comparatively easily reduced in resistance. It is possible to realize a favorable electrical connection by a P-type conductor layer between the pixel electrode or data line and the source or drain region.

In one form of a method for manufacturing an electrooptical substrate device of the invention, in the opening step, the contact hole is opened in a pillar form. The predetermined angle X in the ion implant step is set to satisfy $0 < X \leq \tan^{-1}\{(a-2c)/2e\}$, where a diameter of the contact hole is "a", a depth of the contact hole is "e", and a film thickness of the material film is "c".

In this form, the contact hole is opened in a pillar form, e.g., in a circular or angular form. Accordingly, the material film region that is formed on the side surface of the same is sharply vertical. Nevertheless, because the predetermined angle X in the ion implant process is set such that 0<X, ions can be implanted to the material film region formed on the side surface of the contact hole. Moreover, because the predetermined angle X is set to satisfy $X \leq \tan^{-1}\{(a-2c)/2e\}$, ions can also be implanted to the bottom surface center of the contact hole. Accordingly, by providing ion implantation, e.g., in a plurality of directions, such as in four directions at a different timing or simultaneously, ions can be implanted to all or almost all of the region of the bottom and side surfaces of the contact hole.

In another form of a method for manufacturing an electrooptical substrate device of the invention, in the opening step, the contact hole is opened in a circular or pyramidal cone form, broadening in a direction from the interlayer insulating film toward the conductor layer. The predetermined angle X in the ion implant step is set to satisfy $0 \leq X \leq \tan^{-1}\{(d-a)/2e\}$, where the diameter at the bottom surface is "a", a diameter at an opening edge of the contact hole is "d", a depth of the contact hole is "e", and a film thickness of the material film is "c".

In this form, the contact hole is opened in a circular or pyramidal cone form, broadening in a direction toward the conductor layer, i.e., opened in the upper direction over the substrate. Accordingly, the material film region that is formed on the side surface of the same is vertical in an inclined fashion. Nevertheless, because the predetermined angle X in the ion implant process is set such that $0 \leq X$, ions can be implanted to the material film region formed on the side surface of the contact hole. Particularly, because there is a slant in the side surface of the contact hole, even if X=0, ions can be implanted to the material film region that is formed on the side surface of the contact hole depending upon the degree thereof. Moreover, because the predetermined angle is set to satisfy $X \leq \tan^{-1}\{(d-a)/2e\}$, ions can also be implanted to the bottom surface center of the contact hole. Accordingly, by providing ion implantation, e.g., in a plurality of directions, such as four directions in different timing or simultaneously as noted above, ions can be implanted to all or almost all of the region of the bottom and side surfaces of the contact hole.

Otherwise, in another form of a method for manufacturing an electrooptical substrate device of the invention, in the opening step, the contact hole is opened, and has a first contact hole portion opened in a circular or pyramidal cone form, broadening in a direction from the interlayer insulating film toward the conductor layer, and a second contact hole portion opened in a pillar form continuing from the bottom of the first portion. The predetermined angle X in the ion implant step is set to satisfy $0 < X \leq \tan^{-1}(a-2c)/2(c \sin Y+b-c\}$, where $Y=\tan^{-1}\{(d-a)/2e\}$, where a diameter of the second contact hole portion is "a", a diameter at an opening edge of the first contact hole portion is "d", a depth of the first contact hole portion is "e", a depth of the second contact hole portion is "b", and a film thickness of the material film is "c".

In this form, the contact hole has a first hole portion that is opened in a circular or pyramidal cone form, broadening in a direction of toward the conductor layer, and a second hole portion opened in a pillar-form continuing from a bottom of the first portion. On the substrate, the contact hole has a pillar-like contact hole, as noted above, opened as a second contact hole portion, and a circular or pyramidal cone formed contact hole, as noted above, is opened as a first contact hole portion continuing to the above from the contact hole (toward an opening of the contact hole). Accordingly, the material film region that is formed on the side surface of the first contact hole portion is slanted. Furthermore, the material film region that is formed on the side surface of the second contact hole portion is nearly sharply vertical. Nevertheless, because the predetermined angle X in the ion implant process is set such that 0<X, ions can be implanted to the material film region formed on the side surface of the first and second contact hole portions. Moreover, because the predetermined angle X is set to satisfy $X \tan^{-1} \leq (a-2c)/2(c \sin Y+b-c)$ where $Y=\tan^{-1}\{(d-a)/2e\}$, ions can also be implanted to the bottom surface center of the second contact hole portion. Accordingly, by providing ion implantation, e.g., in a plurality of directions, such as in four directions at a different timing or simultaneously as noted before, ions can be implanted to all or almost all of the region of the bottom and side surfaces of the contact hole.

A method for manufacturing a substrate device of the invention that addresses the foregoing problem manufactures a substrate device having, on a substrate, an interlayer insulating film in which a hole is opened, and a conductor layer formed on the interlayer insulating film and provided in the hole, structuring at least a part of an electronic element or electronic circuit by the conductor layer on the substrate. The method includes a step of opening the hole in the interlayer insulating film; a step of forming a material film of a predetermined type to be formed into the conductor layer, on the interlayer insulating film in which a hole is opened; and an ion implant step for implanting ions to the formed material film to thereby form the conductor layer. In the ion implant step, ions are implanted with an inclination by a predetermined angle X with respect to a centerline of the hole, such that ions are implanted to a region of the material film that is formed on a side surface of the hole, and the predetermined angle X is set within a range to implant ions to a region of the material film that is formed on a bottom surface of the hole.

In accordance with the method for manufacturing a substrate device of the invention, where forming a conductor layer to be formed into at least a part of an electronic element or electronic circuit on the interlayer insulating film on which a hole is formed, a material film of a predetermined type to be formed into a conductor layer of, e.g., polysilicon, is first formed by a CVD (chemical vapor deposition) process or the like. Thereafter, ions, e.g., B (boron), are implanted to the formed material film, thereby forming a conductor layer.

Particularly, the hole at its side surface is sharply vertical over the substrate. Consequently, if ions are implanted along a centerline of the hole, i.e., along the side surface of the hole in the ion implant process, it is for practical purposes almost or entirely impossible to implant ions to a material film region formed on the side surface. Nevertheless, if ions are implanted in a direction that is greatly inclined from the centerline of the hole, it will be, for practical purposes, almost or entirely impossible to implant ions to a material film region that is formed on a bottom surface in the hole. This is because the hole at its edge and peripheral portion prevents an ion path directed with inclination toward the bottom surface of the hole. In any case, it is difficult or impossible to reduce, without unevenness, the resistance of the material film inside the hole. This makes it difficult to architect a favorable electronic element or electronic circuit by a conductor layer.

In contrast, the invention implants ions with inclination at a predetermined angle X with respect to the contact-hole centerline in the ion implant process, and ions are implanted to the material film region formed on the side surface of the hole. At the same time, because the predetermined angle X is set within a range to implant ions to the material film region that is formed on the bottom surface of the hole, ions can also be implanted to the material film region that is formed on the bottom surface of the hole. Consequently, the material film that is inside the hole can be comparatively easily reduced in resistance. It is possible to architect a favorable electronic element or electronic circuit by a conductor layer.

In one form of a method for manufacturing a substrate device of the invention, the substrate device further includes, on the substrate, another conductor layer that is connected to the conductor layer through the hole. The method further includes a step for forming the interlayer insulating film on the another conductor layer.

In accordance with this form, the hole serving as a contact hole is used to architect, on the substrate, an electronic element or electronic circuit including two conductor layers that are insulated by the interlayer insulating film.

In another form of a method for manufacturing a substrate device of the invention, in the step of opening a hole, the hole is formed in a cavity or recess form, not penetrating through the interlayer insulating film.

In accordance with this form, the hole is not in penetration, and not used as a contact hole. Nevertheless, there are cases of manufacturing substrate devices for electronic elements or circuits necessarily or preferably having a conductor layer formed on the surface of an interlayer insulating film where irregularities exist, depending on the various types of requests and apparatus specifications. In such a case, the foregoing effect of the invention is exhibited to a corresponding extent.

In another form of a method for manufacturing a substrate device of the invention, in the ion implant step, ions are implanted in a plurality of directions at a different timing or simultaneously with an inclination by a predetermined angle X with respect to a centerline of the hole. The predetermined angle X is set, in each of the plurality of directions, within a range to implant ions to a region of the material film positioned at a center of a bottom surface of the hole.

In accordance with this form, ions are implanted with inclination in four directions at a different timing or simultaneously in the ion implant process. Concerning each region in the bottom surface of the hole, particularly the ion path directed toward a different region, depending on an inclination direction, is hindered by the edge and peripheral portion of the hole, and the ion path directed toward a different region depending on an inclination direction is not hindered by the edge and peripheral portion of the hole. Moreover, also concerning also each region in the side surface of the hole, the ion path directed toward a different region, depending on an inclination direction, is hindered by the edge and peripheral portion of the hole, and the ion path directed toward a different region depending on an inclination direction is not hindered by the edge and peripheral portion of the hole. Accordingly, by changing the inclination direction of ion implantation, the region to which ions are to be implanted can be changed for each region in the bottom surface of the hole. For this reason, by properly changing the inclination direction, e.g., in three directions, in four directions, in eight directions, or in every direction surrounding the center of the hole, the region in the bottom surface of the hole to which ions are to be implanted can be all or almost all of the region of the bottom surface. At the same time, concerning the side surface of the hole, the region to which ions are to be implanted can be all or almost all the region thereof. Consequently, the material film that is inside the hole can be comparatively easily reduced in resistance.

In one form of a method for manufacturing a substrate device of the invention, in the step of opening a hole, the hole is opened in a pillar form. The predetermined angle X in the ion implant step is set to satisfy $0<X\leq\tan^{-1}\{(a-2c)/2e\}$, where a diameter of the hole is "a", a depth of the hole is "e", and a film thickness of the material film is "c".

In this form, the hole is opened in a pillar form, e.g., in a circular or angular form. Accordingly, the material film region that is formed on the side surface of the same is sharply vertical. Nevertheless, because the predetermined angle X in the ion implant process is set such that $0<X$, ions can be implanted to the material film region that is formed on the side surface of the hole. Moreover, because the predetermined angle X is set to satisfy $X\leq\tan^{-1}\{(a-2c)/2e\}$, ions can also be implanted to the bottom surface center of the hole. Accordingly, by providing ion implantation, e.g., in a plurality of directions, such as in four directions at a different timing or simultaneously, ions can be implanted to all or almost all of the region of the bottom and side surfaces of the hole.

In another form of a method for manufacturing a substrate device of the invention, in the step of opening a hole, the hole is opened in a circular or pyramidal cone form, broadening in a direction from the interlayer insulating film toward the conductor layer. The predetermined angle X in the ion implant step is set to satisfy $0\leq X\leq\tan^{-1}\{(d-a)/2e\}$, where a diameter at a bottom surface of the hole is "a", a diameter at an opening edge of the hole is "d", a depth of the hole is "e", and a film thickness of the material film is "c".

In this form, the hole is opened in a circular or pyramidal cone form, broadening in a direction of toward the conductor layer, i.e., opened toward the above over the substrate. Accordingly, the material film region that is formed on the side surface of the same is slanted. Nevertheless, because the predetermined angle X in the ion implant process is set such that $0\leq X$, ions can be implanted to the material film region that is formed on the side surface of the hole. Because there is a slant in the side surface of the hole, even if X=0, ions can be implanted to the material film region that is formed on the side surface of the hole depending upon the degree thereof. Moreover, because the predetermined angle is set to satisfy $X\leq\tan^{-1}\{(d-a)/2e\}$, ions can also be implanted to the bottom surface center in the hole. Accordingly, by providing ion implantation, e.g., in a plurality of directions, such as in four directions at a different timing or simultaneously as noted above, ions can be implanted to all or almost all of the region of the bottom and side surfaces of the hole.

In another form of a method for manufacturing a substrate device of the invention, in the step of opening a hole, the hole is opened including a first hole portion in a circular or pyramidal cone form, broadening in a direction from the interlayer insulating film toward the conductor layer, and a second hole portion opened in a pillar form continuing from a bottom of the first portion. The predetermined angle X in the ion implant step is set to satisfy $0<X\leq\tan^{-1}(a-2c)/2(c\sin Y+b-c)$, where $Y=\tan^{-1}\{(d-a)/2e\}$, where a diameter of the second hole portion is "a", a diameter at an opening edge of the first hole portion is "d", a depth of the first hole portion is "e", a depth of the second hole portion is "b", and a film thickness of the material film is "c".

In this form, the hole has a first hole portion that is opened in a circular or pyramidal cone form, broadening in a direction toward the conductor layer, and a second hole portion that is opened in a pillar form continuing from a bottom of the first portion. On the substrate, at the floor of the hole, a pillar-like hole, as noted above, is opened as a second hole portion, and a circular or pyramidal cone formed hole, as noted above, is opened as a first hole portion continuing to the upper side from the second hole (opening of the hole). Accordingly, the material film region that is formed on the side surface of the first hole portion is slanted. Furthermore, the material film region formed on the side surface of the second hole portion is nearly sharply vertical. Consequently, because the predetermined angle X in the ion implant process is set such that $0<X$, ions can be implanted to the material film region that is formed on the side surface of the first and second hole portions. Moreover, because the predetermined angle X is set to satisfy $X\leq\tan^{-1}(a-2c)/2(c\sin Y+b-c)$, where $Y=\tan^{-1}\{(d-a)/2e\}$, ions can be implanted also to the bottom surface center of the second hole portion. Accordingly, by providing ion implantation, e.g., in a plurality of directions, such as in four directions at a different timing or simultaneously, as noted above, ions can be implanted to all or almost all of the region of the bottom and side surfaces of the hole.

In another form of a method for manufacturing a substrate device of the invention, in the ion implant step, ions are implanted to make the material film, including polysilicon, into the conductor layer of P-type doped polysilicon.

In accordance with this form, it is possible to architect a preferred electronic element or circuit by a conductor layer of P-type doped polysilicon.

The operation and other advantages of the invention will be made more apparent from the embodiment to be explained in the following.

DETAILED DESCRIPTION OF PREFERRED EMBODIMENTS

Explanations are provided below with regard to the embodiments of the present invention with reference to the drawings.

(Electrooptical Substrate Device)

Figure 1:
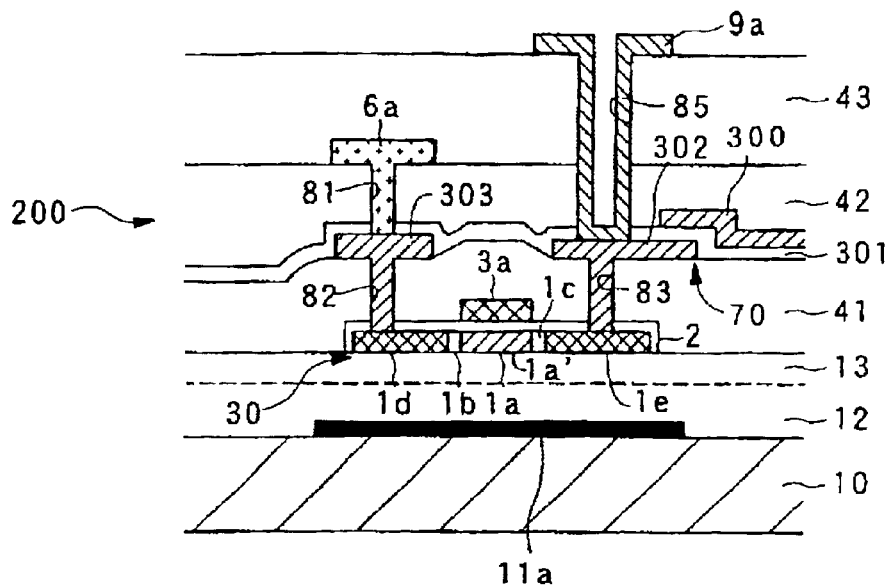
FIG. 1 is a sectional view of an electrooptical substrate device in an embodiment of the present invention.

FIG. 1 is a sectional view of an electrooptical substrate device in an embodiment of the present invention. The electrooptical substrate device in this embodiment constitutes a TFT array substrate of a pair of substrates, e.g., structuring an electrooptical device. However, the application is not limited to this.

In FIG. 1, an electrooptical substrate device 200 is structured, on a substrate 10, with a lower shadow film 11a, a first underlying insulating film 12, a second underlying insulating film 13, a semiconductor layer 1a of a single-crystal silicon layer forming a pixel-switching TFT 30, a scanning line 3a including a gate electrode forming the TFT 30, an insulating film 2 including a gate insulating film forming the TFT 30, a first interlayer insulating film 41, a source electrode 303 of the TFT 30 and a drain electrode 302 of the TFT 30 including a pixel-potential capacitance electrode of a storage capacitance 70, a dielectric film 75 of the storage capacitance 70, a capacitance line 300 including a fixed-potential capacitance electrode of the storage capacitance 70, a second interlayer insulating film 42, a data line 6a, a third interlayer insulating film 43 and a pixel electrode 9a, in this order.

The substrate 10, formed by a glass substrate, a quartz substrate, a silicon substrate or the like, is a transparent substrate where the electrooptical substrate device is a light-transmission type, or an opaque substrate where the electrooptical substrate device is a light-reflection type.

The lower shadow film 11a is formed by a single metal, an alloy, a metal silicide, a polycide or a lamination thereof, including at least one of refractory metals, e.g., Ti (titanium), Cr (chromium), W (tungsten), Ta (tantalum) and Mo (molybdenum). The lower shadow film 11a covers at least a channel region 1a', at an under side thereof in FIG. 1, of a semiconductor layer 1a forming the TFT 30, thereby shadowing the return light traveling toward the TFT 30 from the lower side in FIG. 1.

The first underlying film 12 is formed over the entire surface of the substrate 10, serving to reduce or prevent deterioration in TFT 30 characteristics due to roughening in the surface of the substrate 10 upon polishing or due to dirt or the like left after washing. The underlying insulating film 12 is formed by a silicate glass film, a silicon nitride film or a silicon oxide film in lamination or single-layer of NSG (Non-doped Silicate Glass), PSG (Phosphorus Silicate Glass), BSG (Boron Silicate Glass) or BPSG (Boron Phosphorus Silicate Glass), by using a TEOS (Tetra Ethyl Ortho Silicate) gas, TEB (Tetra Ethyl Borate) gas or TMOP (Tetra Methyl Oxy Phoslate) gas by an atmospheric or low-pressure CVD process or a plasma CVD process. The film thickness is, e.g., approximately 500–2000 nm.

The first underlying film 12 at its surface is planarized by a CMP process. A second underlying film 13, on which a semiconductor layer 1a, is formed is bonded onto the planarized surface. Namely, in this embodiment, the second underlying film 13 is a buried oxide film, on which is architected an SOI structure, on which is formed the semiconductor layer 1a of a single-crystal silicon film. For example, a semiconductor layer 1a is first formed on a separately prepared semiconductor substrate to oxidize the surface thereof, thereby forming a second underlying insulating film 13. After the second underlying film 13 and the first underlying film 12, at their surfaces, are bonded together and thermally processed, the semiconductor substrate is separated to leave the semiconductor layer 1a, thereby obtaining such an SOI structure. The thickness of the semiconductor layer 1a is, for example, approximately 30–150 nm, while the thickness of the insulating film 2 is, for example, approximately 20–150 nm.

The pixel-switching TFT 30, having an LDD (Lightly Doped Drain) structure, is structured with a gate electrode formed as a part of the scanning line 3a, a channel region 1a' of the semiconductor layer 1a to form therein a channel under an electric field from the scanning line 3a, an insulating film 2 including a gate insulating film to insulate between the scanning line 3a and the semiconductor layer 1a, a low-concentration source region 1b and low-concentration drain region 1c of the semiconductor layer 1a, a high-concentration source region 1d and high-concentration drain region 1e of the semiconductor layer 1a, a source electrode 303 and a drain electrode 302.

A first interlayer insulating film 41 is formed on the scanning line 3a to form therein a contact hole 82, communicating between the high-concentration region 1d and the source electrode 303, and a contact hole 83 communicating between the high-concentration drain region 1e and the drain electrode 302. The first interlayer film 41 is formed, for example, by a silicate glass film, a silicon nitride film or silicon oxide film to have a film thickness, for example, of approximately 500–2000 nm.

The pixel electrode 9a is connected to the high-concentration drain region 1e through the contact holes 83 and 85, by way of the drain electrode 302 serving also as an interlevel-connecting conductor layer. The data line 6a is connected to the high-concentration region 1d through the contact holes 81 and 82, by way of the source electrode 303 serving also as an interlevel-connecting conductor layer.

The capacitance line 300, including the fixed-potential capacitance electrode, is formed on the pixel-potential capacitance electrode formed by a part of the drain electrode 302 through the dielectric film 301. The capacitance line 300 is formed of a single metal, an alloy, a metal silicide, a polycide or a lamination thereof, including at least one of refractory metals, e.g., Ti, Cr, W, Ta and Mo. This embodiment architects a storage capacitance 70 by thus oppositely arranging a part of the drain electrode 302 and a part of the capacitance line 300 through the dielectric film 301.

The second interlayer insulating film 42 is formed on the capacitance line 300 to form therein a contact hole 81, communicating between the source electrode 303 and the data line 6*a*, and a contact hole 85 communicating between the drain electrode 302 and the pixel electrode 9*a*. The second interlayer insulating film 42 is formed, for example, by a silicate glass film, a silicon nitride film or a silicon oxide film, to have a film thickness, e.g., of approximately 500–2000 nm.

The data line 6*a* is formed on the second interlayer insulating film 42, on which the third interlayer insulating film 43 is further formed, to form therein the contact hole 85 to the drain electrode 85. The data line 6*a* is formed by a low-resistance metal film of Al (aluminum) or the like to have a predetermined pattern, for example, by sputtering, photolithography or etching. The film thickness is, for example, several hundred nm in order to provide a required conductivity depending upon an interlevel connection width. On the other hand, the third interlayer insulating film 43 is formed, for example, by a silicate glass film, a silicon nitride film or a silicon oxide film, to have a film thickness of approximately 500–2000 nm.

The pixel electrode 9*a* is provided on an upper surface of the third interlayer insulating film 7 thus formed. The pixel electrode 9*a* is formed from a transparent conductive film, such as an ITO (Indium Thin Oxide) film, e.g., by sputtering, photolithography or etching. A rubbed orientation film may be formed as in an electrooptical device.

In the electrooptical substrate device structured as above, particularly the semiconductor layer 1*a* is made of N-type single-crystal silicon, to form therein a P-type high-concentration source region 1*d*, a P-type low-concentration source region 1*b*, a P-type high-concentration drain region 1*e* and a P-type low-concentration source region 1*c*. Namely, the TFT 30 is structured as a P-channel MOS transistor of the enhancement type.

Figure 2:
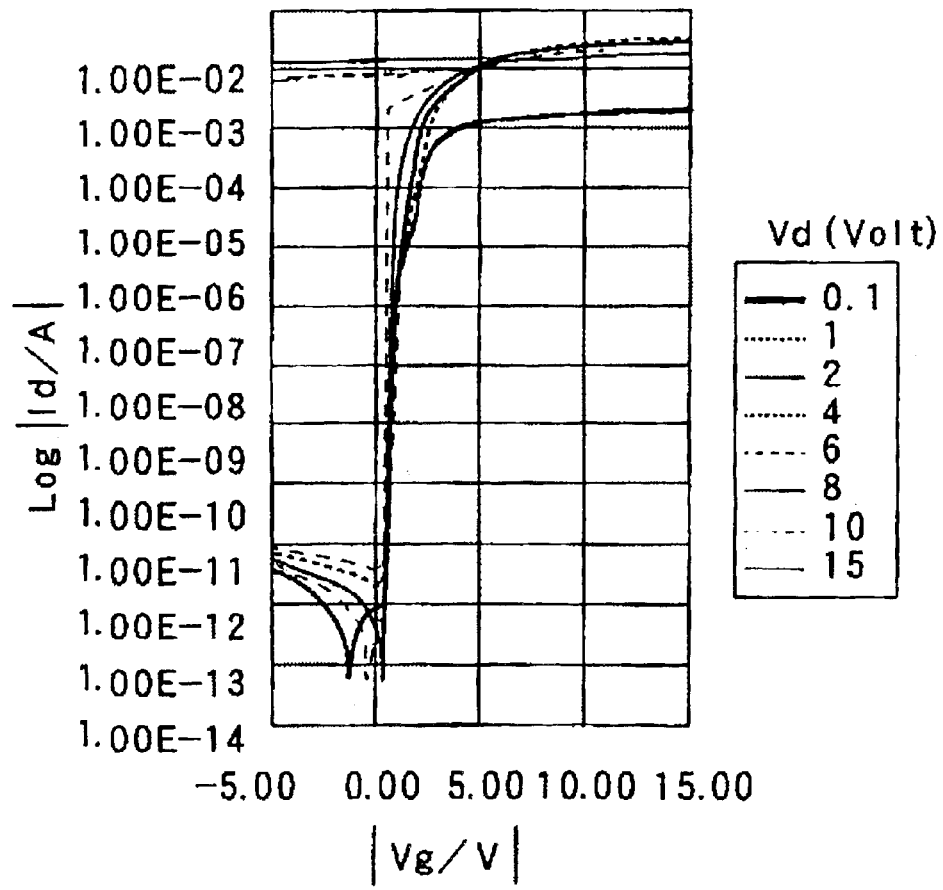
FIG. 2 is a graph showing a drain current (|Id|) against a gate voltage (|Vg|), on various drain voltages (|Vd|), in an SOI-structured N-channel MOS transistor as a comparative example.
Figure 3:
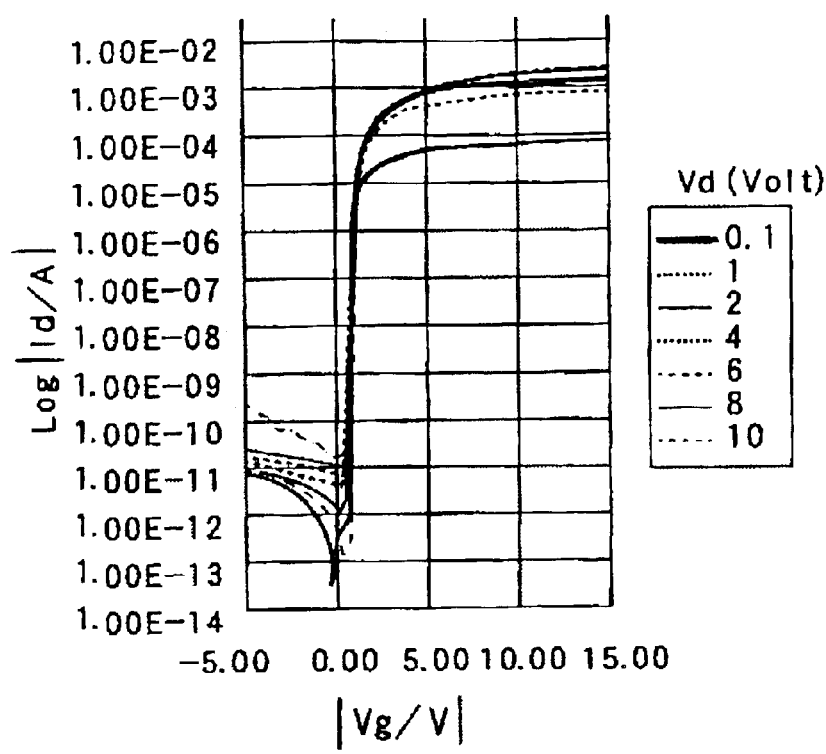
FIG. 3 is a graph showing a drain current (|Id|) against a gate voltage (|Vg|), on various drain voltages (|Vd|), in an SOI-structured P-channel MOS transistor in the present embodiment.

Herein, FIG. 2 is a graph that shows a characteristic of a drain current (|Id|) against a gate voltage (|Vg|), on various drain voltages (|Vd|), in an SOI-structured N-channel MOS transistor as a comparative example. Meanwhile, FIG. 3 is a graph that shows a characteristic of a drain-current (|Id|) against a gate voltage (|Vg|), on various drain voltages (|Vd|), in an SOI-structured P-channel MOS transistor as in the present embodiment.

In the comparative example corresponding to FIG. 2, a body contact, as described in the background art, is not provided which extracts surplus carriers built up in the semiconductor layer during operation. Meanwhile, such a body contact is not provided in the present embodiment corresponding to FIG. 3. The comparative example provides a channel length of 2.0 μm, an LDD length of 1.0 μm and a channel width of 20 μm, while the present embodiment provides a channel length of 3.0 μm, an LDD length of 1.0 μm and a channel width of 20 μm.

As shown from the characteristic diagrams, in the comparative example, a more favorable transistor characteristic is obtained for a smaller drain current (|Vd|) than that of the present embodiment. This is due to the fact that the N-channel MOS transistors, having electrons comparatively high in mobility as the majority carriers, basically have higher performance than the P-channel MOS transistors having holes comparatively low in mobility as the majority carriers.

However, where the drain voltage (|Vd|) increases to a certain degree within a range practically used in the electrooptical substrate device of this type, a favorable transistor characteristic is not available in the comparative example. In contrast, in the present embodiment, even where the drain voltage (|Vd|) increases to a certain degree within the range practically used in the electrooptical substrate device of this type, a favorable transistor characteristic is obtained. Particularly, because the TFT 30 of the present embodiment has an SOI structure, the performance as a transistor can be provided without inferiority, as compared to the MOS transistor structured using, as a semiconductor layer, polysilicon or amorphous silicon, for example. The present embodiment, because of the P-channel type, satisfactorily requires a small hole impact-ionization ratio of holes noted above. There is practically no problem with the parasitic bipolar phenomenon due to the substrate-float effect noted above which is different from the N-channel type.

Consequently, the comparative example for practical purposes requires a body contact to extract built-up surplus carriers, whereas the present embodiment does not require such a body contact.

In addition, in the embodiment shown in FIG. 1, particularly the source electrode 303 connected to the P-type high-concentration source region 1*d* is formed by a P-type conductor layer. Consequently, no PN junction exists between the two structures to obtain favorable electrical connection. Similarly, the drain electrode connected to the P-type high-concentration drain region 1*e* is formed by a P-type conductor layer. Accordingly, no PN junction exists between the two to obtain favorable electrical connection. Such a P-type conductor layer can be comparatively easily formed by doping to the P-type by ion implantation after depositing a conductor layer, such as a polysilicon film. Meanwhile, the drain electrode 302 and source electrode 303 have a film thickness, for example, of approximately 50–500 nm.

Incidentally, in the embodiment, by using a transparent substrate of quartz glass, glass or the like as the substrate 10 and a transparent electrode of an ITO film or the like as the pixel electrode 9, it is possible to architect a transparent-type electrooptical substrate device or a reflection-type electrooptical device that light reflects through the pixel electrode 9*a* or the pixel electrode 9*a* and substrate 10. Otherwise, in the embodiment, by using a reflecting electrode of an Al film or the like as the pixel electrode 9*a*, it is possible to architect a reflective-type electrooptical substrate device. Furthermore, by using a semi-transparent reflecting electrode or semi-transparent reflecting plate, it is possible to architect a semi-transparent reflection-type electrooptical device that is switchable between reflection and transmission types.

Next, an explanation is provided regarding an electrooptical apparatus of the invention having an electrooptical substrate device structured as discussed above, on the basis of the drawings. The below embodiment applies an electrooptical apparatus to a liquid crystal apparatus.

(Electrooptical Apparatus Overall Structure)

Figure 4:
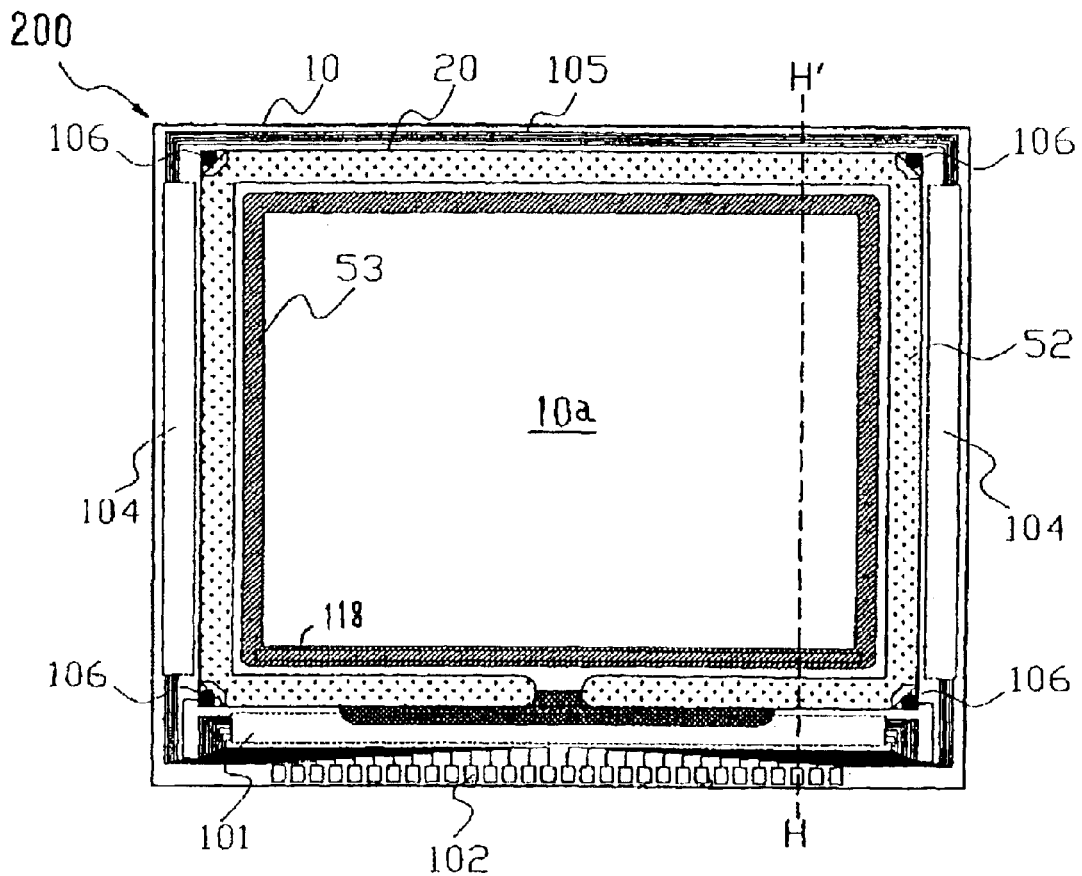
FIG. 4 is a plan view of a TFT array substrate together with the constituent elements formed thereon in an electrooptical apparatus of an embodiment of the invention, as viewed from the side of a counter substrate.
Figure 5:
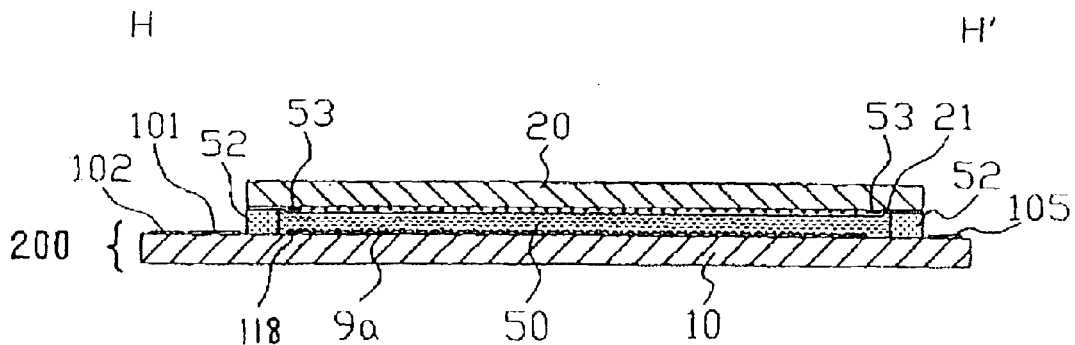
FIG. 5 is a sectional view taken along plane H–H' in FIG. 4.

First, an explanation is provided regarding the overall structure of an electrooptical apparatus in an embodiment of the invention, with reference to FIGS. 4 and 5. Herein, a drive-circuit-incorporating-type TFT active-matrix drive schemed liquid-crystal apparatus is provided as an example of an electrooptical apparatus.

FIG. 4 is a plan view of a TFT array substrate, together with the constituent elements formed thereon, as viewed from a side of a counter substrate. FIG. 5 is a sectional view taken along plane H–H' in FIG. 4.

In FIGS. 4 and 5, the electrooptical apparatus for the embodiment is arranged oppositely with an electrooptical substrate device 200 shown in FIG. 1 and a counter substrate 20.

A liquid crystal layer 50 is filled between a substrate 10 that structures the electrooptical substrate device 200 and the counter substrate 20. The substrate 10 and the counter substrate 20 are bonded together by a seal member 52 provided in a seal region positioned in the periphery of an image display region 10a. The seal member 52 is formed of a resin, for example, thermoset resin, thermo-and-optical set resin, optical set resin or UV-set resin, in order to bond the two substrates together. In the manufacturing process, the resin is applied on the substrate 10 and then cured by heating, heating and light radiation, light radiation or UV-ray radiation.

The seal member 52 is mixed with a gap material of glass fiber, glass beads or the like, in order to provide a spacing between the substrates (gap between the substrates) to a predetermined value. Namely, the electrooptical apparatus of the embodiment is small in size as a projector light bulb, and suited for display with magnification. Where the electrooptical apparatus is a large-sized liquid crystal apparatus, such as a liquid crystal display or liquid crystal television for display without magnification, such a gap member may be contained in the liquid crystal layer 50.

Vertical conductor members 106 are respectively provided at four corners on the counter substrate 20. Electrical conduction is provided between the vertical conductor terminals provided on the substrate 10 and the counter electrode 21 provided on the counter substrate 20.

In FIGS. 4 and 5, a shadow frame 53 is provided on the counter substrate 20 at a position parallel with, and inside, a seal region having the seal member 52, to define an image display region 10a. It is needless to say that the frame 53 may be provided on the substrate 10. A data-line drive circuit 101 and external-circuit connecting terminals 102 are provided along one side on the substrate 10, in an outer area of the seal region where is set the seal member 52 of the peripheral region extending in the periphery of the image display region. Scanning-line drive circuits 104 are provided along the two sides adjacent to that side. Furthermore, a plurality of interlevel connections 105 are provided along the remaining one side on the substrate 10, in order to connect between the scanning-line drive circuits 104 provided on the two sides of the image display region 10a.

In FIG. 5, an orientation film is formed on the substrate 10 over the pixel electrodes 9a after forming pixel-switching TFTs, interlevel connections of scanning and data lines. On the other hand, an orientation film is formed on the counter substrate 20 in the uppermost layer besides the counter electrode 21. Meanwhile, the liquid crystal layer 50 is of a liquid crystal mixed, for example, with one or a plurality of nematic liquid crystals, to assume a predetermined orientation state between the pair of orientation films.

In the embodiment, a sampling circuit 118 is provided in a region beneath the frame 53 on the substrate 10. The sampling circuit 118 is configured to sample image signals on an image signal line in response to a sampling-circuit drive signal supplied from the data-line drive circuit 101, to supply it onto the data line.

(Electrooptical Apparatus Circuit Configuration and Operation)

Figure 6:
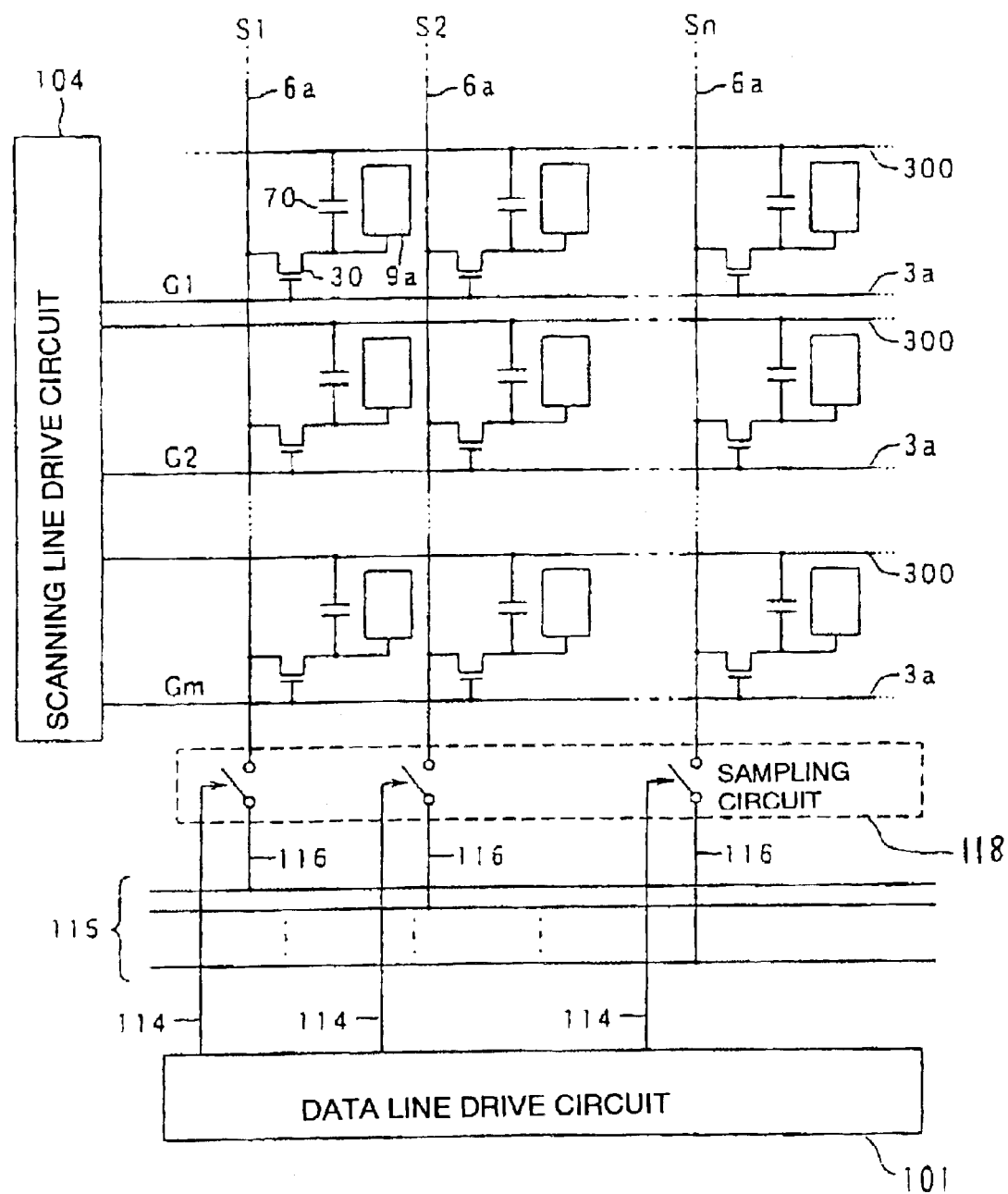
FIG. 6 is a schematic of an equivalent circuit of the various elements, interlevel connections and the like provided on a plurality of pixels in a matrix form structuring an image display region in the electrooptical apparatus in an embodiment of the invention.

Next, an explanation is provided regarding the circuit configuration and operation of the electrooptical apparatus structured as the above with respect to FIG. 6. FIG. 6 is a schematic showing the equivalent and peripheral circuits of various elements, interlevel connections, etc. in a plurality of pixels formed in a matrix form constituting an image display region of the electrooptical apparatus.

In FIG. 6, the electrooptical apparatus of the embodiment has a plurality of pixels formed in a matrix form to constitute an image display region. Each pixel is formed with a pixel electrode 9a and a TFT 30 to switch the pixel electrodes 9a. The data lines 6a that supply an image signal are electrically connected to the source electrodes of the TFTs.

In the peripheral region outside of the pixel display region 10a, the data line 6a at one end (lower end in FIG. 6) is connected to the drain of each switching element, e.g., of a TFT, of the sampling circuit 118. On the other hand, the image signal line 115 is connected to the source of the TFT of the sampling circuit 118 through an extension line 116. The sampling-circuit drive signal line 114, connected to the data-line drive circuit 101, is connected to the gate of the TFT of the sampling circuit 118. The image signal S1, S2, . . . , Sn on the image signal line 115 is sampled and supplied to the data line 6a by the sampling circuit 118, in response to a sampling-circuit drive signal supplied from the data-line drive circuit 101 through the sampling-circuit drive signal line 114.

The image signals S1, S2, . . . Sn that write onto the data lines 6a may be supplied in the order of lines or supplied to the adjacent data lines 6a based on a group thereof.

Meanwhile, the scanning line 3a is electrically connected to the gate of the pixel-switching TFT 30, so that scanning signal G1, G2, . . . Gm is pulsatively applied in this order of lines in predetermined timing onto the scanning lines 3a by the scanning-line drive circuit 104. The pixel electrode 9a is electrically connected to the drain of the TFT 30. By switching off the TFT 30 as a switching element for a predetermined period, an image signal S1, S2, . . . , Sn supplied from the data line 6a is written in predetermined timing. The image signal S1, S2, . . . , Sn in a predetermined level, written to the liquid crystal as an example of an electrooptic substance through the pixel electrode 9a, is held for a constant period in a gap to the counter electrode 21 formed on the counter substrate. The liquid crystal is changed in orientation or order of the set of molecules due to the potential level applied, thereby enabling light modulation and tonal representation. In the normally white mode, the transmissivity for incident light decreases depending upon a voltage applied based on each pixel. In the normally black mode, the transmissivity for incident light increases depending upon a voltage applied based on each pixel. From the entire electrooptical apparatus, light is emitted having a contrast in accordance with an image signal. Herein, in order to reduce leakage or prevent the held image signal from leaking, a storage capacitance 70 is added in parallel with the liquid-crystal capacitance to be formed between the pixel electrode 9a and the counter electrode 21. The storage capacitance 70 is formed between a high-concentration drain region 1e of the pixel switching TFT 30, and a constant-potential capacitance line 300 through a dielectric film 301.

Incidentally, in addition to the data-line drive circuit 101, the scanning-line drive circuit 104, the sampling circuit 118 and the like, on the substrate 10 may be formed a precharge circuit to supply a precharge signal in a predetermined voltage level in advance to an image signal to the data lines 6a, and an inspection circuit for inspecting for quality, defects, etc. of the electrooptical device during manufacture or upon shipment and so on.

(Electrooptical Apparatus Pixel-Region Structure)

Figure 7:
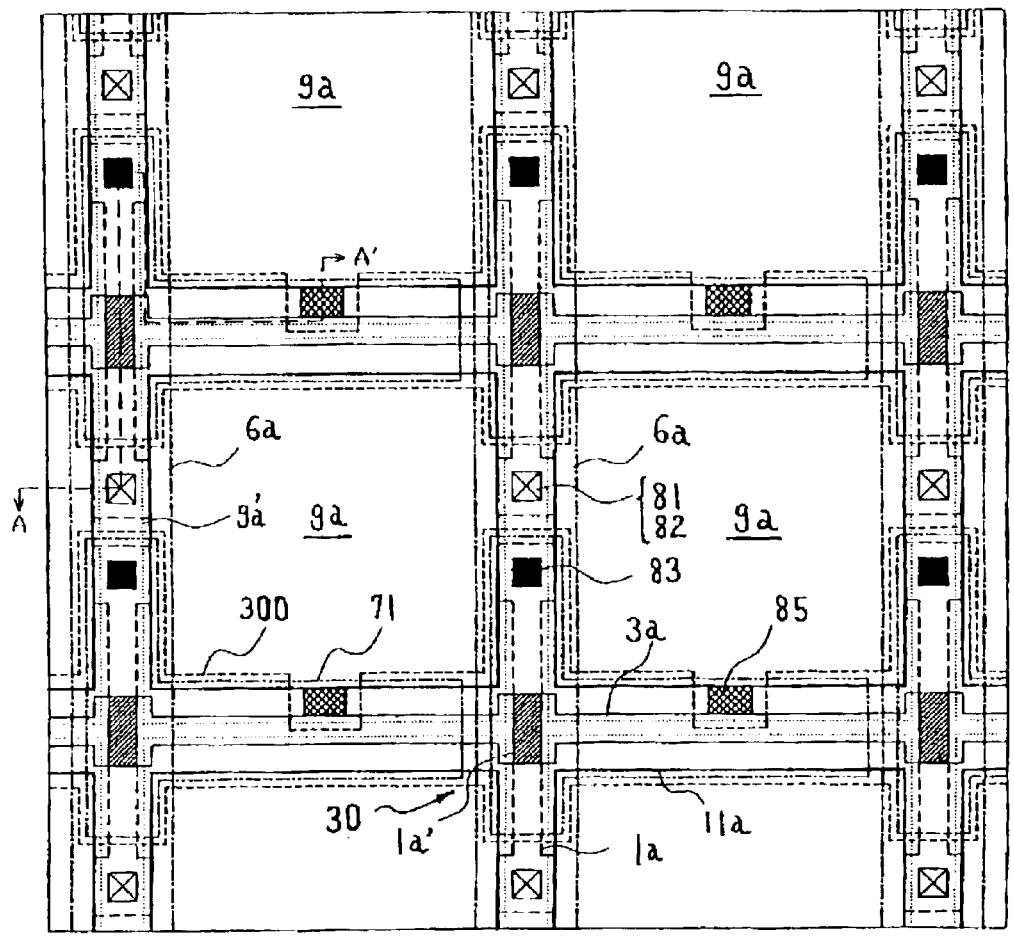
FIG. 7 is a plan view of a plurality of adjacent pixel groups on a TFT array substrate on which are formed data lines, scanning lines, pixel electrodes and the like in the electrooptical apparatus of the embodiment.
Figure 8:
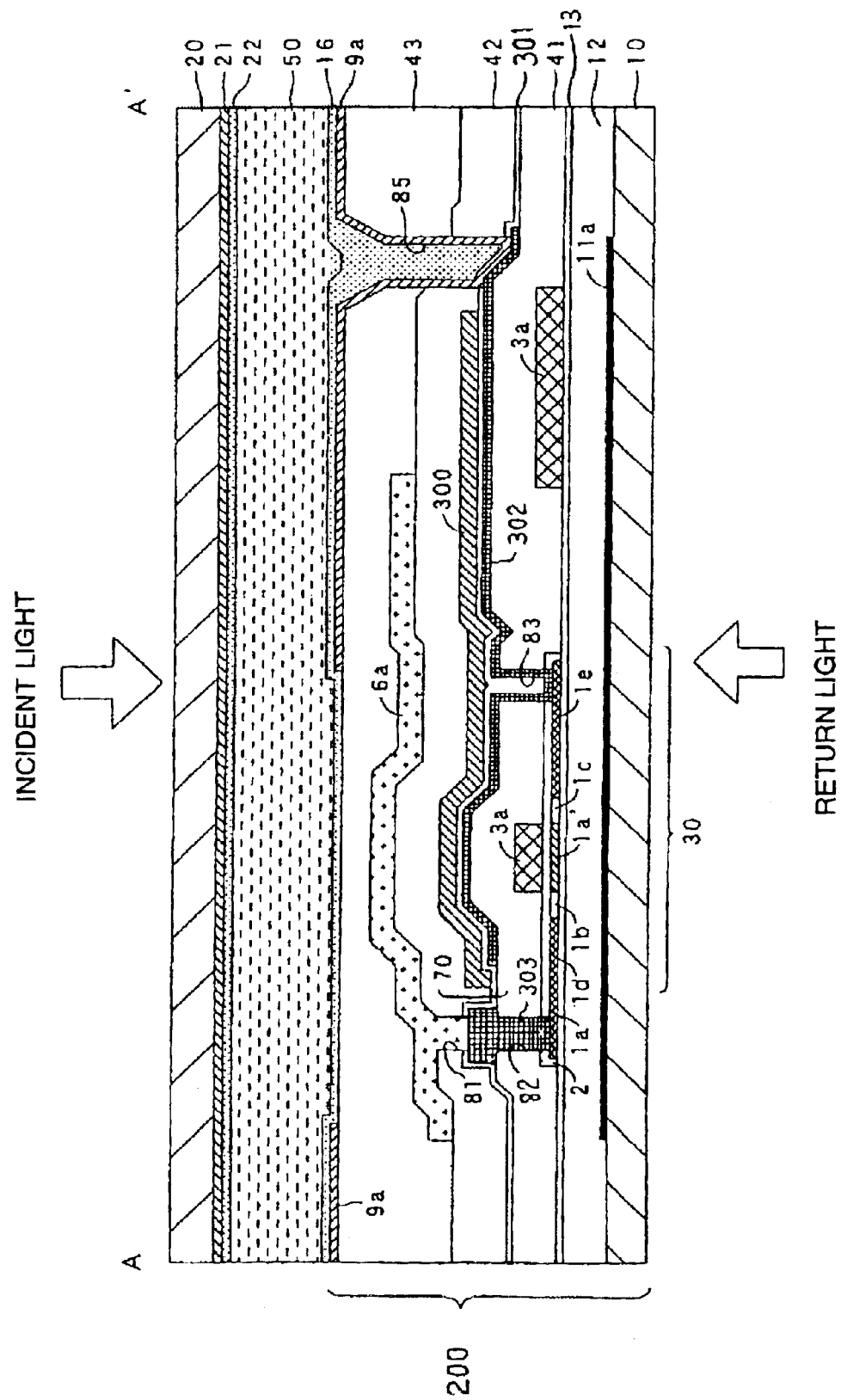
FIG. 8 is a sectional view taken along plane A–A' in FIG. 7.
Figure 9:
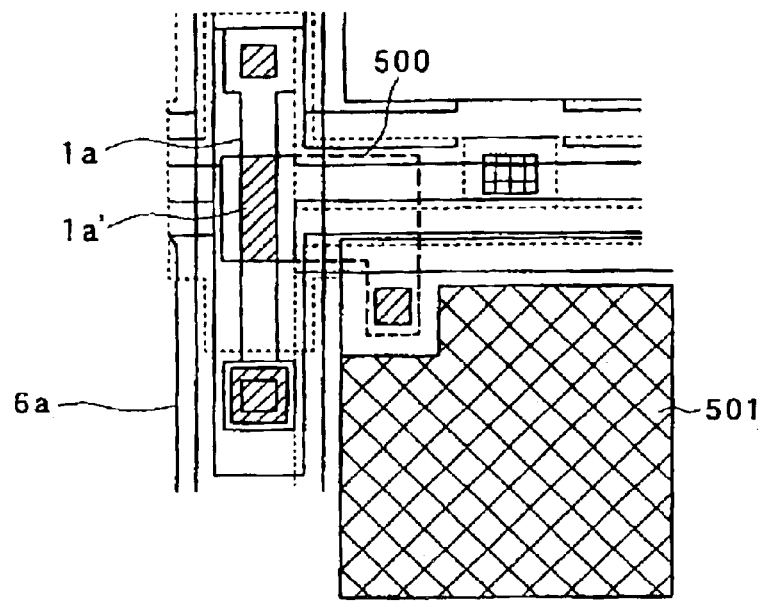
FIG. 9 is a plan view of a conductor layer that removes surplus carriers in a pixel-switching TFT in a comparative example.

An explanation is provided regarding on the pixel-region structure of the electrooptical apparatus of the embodiment, with reference to FIGS. 7 to 9. FIG. 7 is a plan view of a plurality of adjacent pixels of an electrooptical apparatus formed with data lines, scanning lines, pixel electrodes and so on. FIG. 8 is a sectional view taken along plane A–A' in FIG. 7. Meanwhile, FIG. 9 is a plan view concerning one pixel, showing a body contact in a comparative example. Note that, in FIG. 8, the layers and members are not intended to be of scale, and are merely drawn to enhance viewability thereof.

In FIG. 7, a plurality of transparent pixel electrodes 9a (contour being shown by dotted lines 9a') are provided in a matrix form on a substrate 10 of the electrooptical apparatus. The data lines 6a and the scanning lines 3a are provided, respectively, along vertical and horizontal boundaries of the pixel electrodes 9a.

Meanwhile, the scanning line 3a is arranged in a manner opposed to the rightward-downward-hatched channel region 1a' of the semiconductor layer 1a in the figure. The scanning line 3a serves as a gate electrode. In this manner, on each crossing point of the scanning line 3a and the data line 6a, a pixel-switching TFT 30 is provided having the scanning line 3a as a gate electrode arranged opposite in the channel region 1a'.

In the embodiment, the capacitance line 300 is formed superimposed over the scanning line 3a forming region, as shown by bold lines in the figure. More specifically, the capacitance line 300 has a line body portion extending along the scanning line 3a, a projecting portion projecting up along the data line 6a at each point crossing with the data line 6a and a tying portion slightly tying at a point corresponding to a contact hole 84.

As shown in FIGS. 7 and 8, the data line 6a is electrically connected, by way of connecting the source electrode 303, to the semiconductor layer 1a at its high-concentration source region 1d through the contact hole 81 and contact hole 82. On the other hand, the pixel electrode 9a is electrically connected to a high-concentration drain region 1e of the semiconductor layer 1a through the contact holes 83, 85, by way of utilizing, as an interlevel-connecting layer, the drain electrode 302 formed by the same film as the source electrode 303.

By thus utilizing the drain electrode 302 as an interlevel-connecting layer, even where the interlayer distance between the pixel electrode 9a and the semiconductor layer 1a forming the TFT 30 is long, e.g., approximately 1000 nm, the two structures can be favorably connected by the two contact holes 83 and 84 that are comparatively small in diameter and arranged in series while avoiding the technical difficulty of connecting them by one contact hole, thereby making it possible to enhance the pixel opening ratio. Particularly, the use of such an interconnecting layer serves to reduce or prevent the penetration of etching upon opening a contact hole. Similarly, by using the source electrode 303, even where the interlayer distance is long between the data line 6a and the semiconductor layer 1a forming the TFT 30, the two structures can be favorably connected by the two contact holes 81 and 82 that are comparatively small in diameter and arranged in series while avoiding the technical difficulty of connecting them by one contact hole.

As shown in FIGS. 7 and 8, by oppositely arranging the drain electrode 302 and the capacitance line 300 through the dielectric film 301, the storage capacitance 70 is architected in the region overlapped with the scanning line 3a and region overlapped with the data line 6a as viewed in the plan.

Namely, the capacitance line 300 extends in a manner covering the scanning line 3a and has, in a region beneath the data line 6a, a projecting portion projecting in a manner covering the drain electrode 302, thus being formed in a comb form. The drain electrode 302 forms an L-island capacitance electrode having one end extending along the projecting portion of the capacitance line 300 in the region beneath the data line 6a from the intersection of the scanning line 3a and data line 6a, and the other end extending along the capacitance line 300 in the region above the scanning line 3a to the vicinity of adjacent data line 6a. The storage capacitance 70 is formed in the region where the L-shaped drain electrode 302 is overlapped with the capacitance line 300 through the dielectric film 301.

The drain electrode 302, including one capacitance electrode of the storage capacitance 70, is connected to the pixel electrode 9a through the contact hole 85 and to the high-concentration drain region 1e through the contact hole 83, to have a pixel-electrode potential.

The capacitance line 300, including the other capacitance electrode of the storage capacitance 70, extends from the pixel display region in which is set the pixel electrodes 9a to the periphery thereof and electrically connected to a constant potential source, to have a fixed potential. The constant potential source may be a positive or negative constant power source supplied to the scanning-line drive circuit to supply a TFT-30-driving scanning signal to the scanning line 3a, or to the data-line drive circuit to control the sampling circuit supplying an image signal onto the data line 6a, or may be a constant potential to be supplied to the counter substrate.

The dielectric film 301 of the storage capacitance 70 is formed by a silicon oxide film, a silicon nitride film or the like, such as an HTO film (high-temperature oxide film) or an LTO film (low-temperature oxide film), having a comparatively small thickness, e.g., a film thickness of approximately 5–200 nm. The dielectric film 301 may be a thermal oxide film obtained by oxidizing the surface of the drain electrode 302. From the viewpoint of increasing the storage capacitance 70, the dielectric film is preferably as thin as possible as long as the reliability in film thickness is fully available.

As shown in FIG. 8, the electrooptical apparatus has the electrooptical substrate device 200 and the oppositely arranged transparent counter substrate 20. The counter substrate 20 is formed, for example, by a glass substrate or a quartz substrate. The substrate 10 has a pixel electrode 9a, on which is provided an orientation film 16 subjected to predetermined orientation process, such as rubbing. Meanwhile, the orientation film 16 is formed by an organic film of polyimide or the like.

On the other hand, the counter substrate 20 has the counter electrode 21 provided all over the surface thereof, on an under side of which is provided an orientation film 22 subjected to a predetermined orientation process, such as rubbing. The counter electrode 21 is a transparent conductive film, e.g., of ITO. Meanwhile, the orientation film 22 is an organic film of polyimide or the like.

A pixel-switching TFT 30 is provided on the substrate 10 at a position adjacent to each pixel electrode 9a in order to switch the pixel electrode 9a.

A shadow film may further be provided on the counter substrate 20. With such a structure, it is possible to suppress incident light from intruding from the side of the counter substrate 20 into the channel region 1a' of the semiconductor layer 1a of the TFT 30, or into the low-concentration source region 1b and low-concentration drain region 1c thereof. Furthermore, the shadow film on the counter substrate, if formed at a surface to be radiated by incident light by the use of a highly reflective film, serves to reduce or prevent temperature rise of the electrooptical apparatus.

Incidentally, in the embodiment, shadowing may be provided in the region extending along the data line 6a of each pixel shadow area by a shadowing data line 6a of Al film or the like. Otherwise, by forming the capacitance line 300 by a shadow film, the channel region 1a' can be shadowed.

A liquid crystal, as an example of an electrooptical substance, is filled between the substrate 10 having the pixel electrodes 9a arranged facing the counter electrode 21 and the counter substrate 20, in a space surrounded by the seal member, thereby forming a liquid crystal layer 50. The liquid crystal layer 50 assumes a predetermined orientation by the orientation film 16 and 22 in a state where no electric field is applied from the pixel electrode 9a. The liquid crystal layer 50 is formed of a liquid crystal, e.g., of a nematic liquid crystal in one or a plurality of types.

In this embodiment, particularly the TFT 30 provided in each pixel, is a P-channel type having an SOI structure, and has a sufficiently small impact ionization ratio of holes as noted before. Thus, there is for practical purposes almost no problem with the parasitic bipolar phenomenon due to a substrate float effect. Accordingly, the opening area in each pixel can be provided comparatively broad, as shown in FIG. 7.

Contrary to this, in the case of the N-channel TFT having an SOI structure explained using FIG. 2, the impact ionization ratio of holes is great. Accordingly, the parasitic bipolar effect due to the substrate float effect is conspicuous. Thus, there is a need to additionally form a conductor layer 500 to remove the surplus carriers built up in the channel region 1a', as shown in FIG. 9. For this reason, as apparent from FIG. 9, the opening region 501 of each pixel shown by hatching in FIG. 9 must be narrowed due to the existence of the conductor layer 500 for providing a body contact.

In this manner, this embodiment can increase the opening ratio in each pixel in an amount correspondingly to the amount not requiring a body contact. At the same time, there is a reduced or no possibility of causing complications in the overlying structure of each pixel and in the manufacturing process. Accordingly, active matrix drive is possible by the TFT 30 comparatively high in performance, providing image display with brightness and high quality.

Incidentally, as was shown in FIGS. 4 to 6, although the electrooptical apparatus of the embodiment is of the peripheral-circuit-incorporation type, the peripheral circuit may be configured including an N-channel transistor of an SOI structure. It is desired to provide such an N-channel transistor with a conductor layer to suck out surplus carriers, but not to provide the P-channel transistor in the image display region with such a conductor layer to suck out surplus carriers. This structure is advantageous in that a higher-performance peripheral circuit, including an N-channel TFT having a conductor layer to suck out surplus carriers, is used in the peripheral region having a comparatively sufficient area to fabricate circuits, enabling a higher level of driving or control. Furthermore, by structuring the TFT constituting such a peripheral circuit and the TFT 30 in each pixel in the same layer by the process at least partly common, it is possible to suppress the number of semiconductor layers, number of insulating films and number of conductor layers required in the overall apparatus.

In the embodiment explained above, by overlaying many conductor layers, steps will occur in the regions along the data line 6a and scanning line 3a. However, a planarizing process may be made by forming a trench in the substrate 10, first underlying insulating film 12, first interlayer insulating film 41 and second interlayer insulating film 42 to bury therein the interlevel connection of the data line 6a, TFT 30 and the like. Otherwise, such a planarizing process may be made by polishing the step on the upper surface of the third interlayer insulating film 43 and second interlayer insulating film 42 through a CMP process or by using organic SOG for planarization.

Furthermore, in the embodiment explained above, the pixel-switching TFT 30 preferably has an LDD structure as shown in FIG. 8. However, it may have an offset structure that no impurity implantation is made to the low-concentration source region 1b and low-concentration drain region 1c, or may be a self-aligned TFT that the gate electrode formed by a part of the scanning line 3a is used as a mask to implant an impurity at high concentration thereby forming high-concentration source and drain regions in a self-aligned fashion. Meanwhile, the embodiment is of a single-gate structure, such that only one gate electrode of the pixel-switching TFT 30 is set between the high-concentration source region 1d and the high-concentration drain region 1e. However, two or more of gate electrodes may be arranged between them. The TFT, if structured with double, triple or more gates in this manner, makes it possible to reduce or prevent the leak current at the junction between the channel, source and drain regions, making possible to reduce the current when off. The TFTs constituting the peripheral circuits can be architected by the TFTs in various kinds in the similar way.

In the embodiment explained with reference to FIGS. 1 to 9, a data-line drive circuit 101 and scanning-line drive circuit 104 may be electrically, mechanically connected to a driving LSI mounted, e.g., on TAB (Tape Automated Bonding) through an anisotropic conductive film provided in the periphery of the substrate 10, in place of being provided on a TFT array substrate 10. Meanwhile, a polarizing film, a phase-difference film, a polarizing plate and the like are arranged depending, e.g., on the operation mode, such as TN (Twisted Nematic) mode, VA (Vertically Aligned) mode and PDLC (Polymer Dispersed Liquid Crystal) mode or normally-white mode/normally-black mode on each of the side of the counter substrate 20 where projection light is incident and the side of the substrate 10 where emission light emits.

The electrooptical apparatus in the embodiment explained above, because of being applied for a projector, uses three electrooptical devices respectively as RGB light bulbs, where the respective colors of light dissolved through RGB-color-separation dichroic mirrors are incident as projection light on the light bulbs. Accordingly, each embodiment does not have a color filter on the counter substrate 20. However, an RGB color filter may be formed together with its protection film on the counter substrate 20 in a predetermined region facing the pixel electrode 9a where the counter substrate is not formed with a shadow film. This makes it possible to apply the electrooptical apparatus of each embodiment to a direct-viewing type or reflection-type color electrooptical apparatus other than a projector. Meanwhile, micro lenses may be formed in a correspondence of one pixel to one thereof on the counter substrate 20. Otherwise, it is possible to form a color filter layer of color resist in a position beneath the pixel electrodes 9a facing the RGB on the TFT array substrate 10. This enhances the efficiency of focusing incident light thereby realizing a bright electrooptical apparatus. Furthermore, by depositing many interference layers that are different in refractive index on the counter substrate 20, a dichroic filter may be formed to produce RGB colors by utilizing light interference. The counter substrate having a dichroic filter realizes even brighter color electrooptical apparatus.

(Embodiment on Electronic Apparatus)

Figure 10:
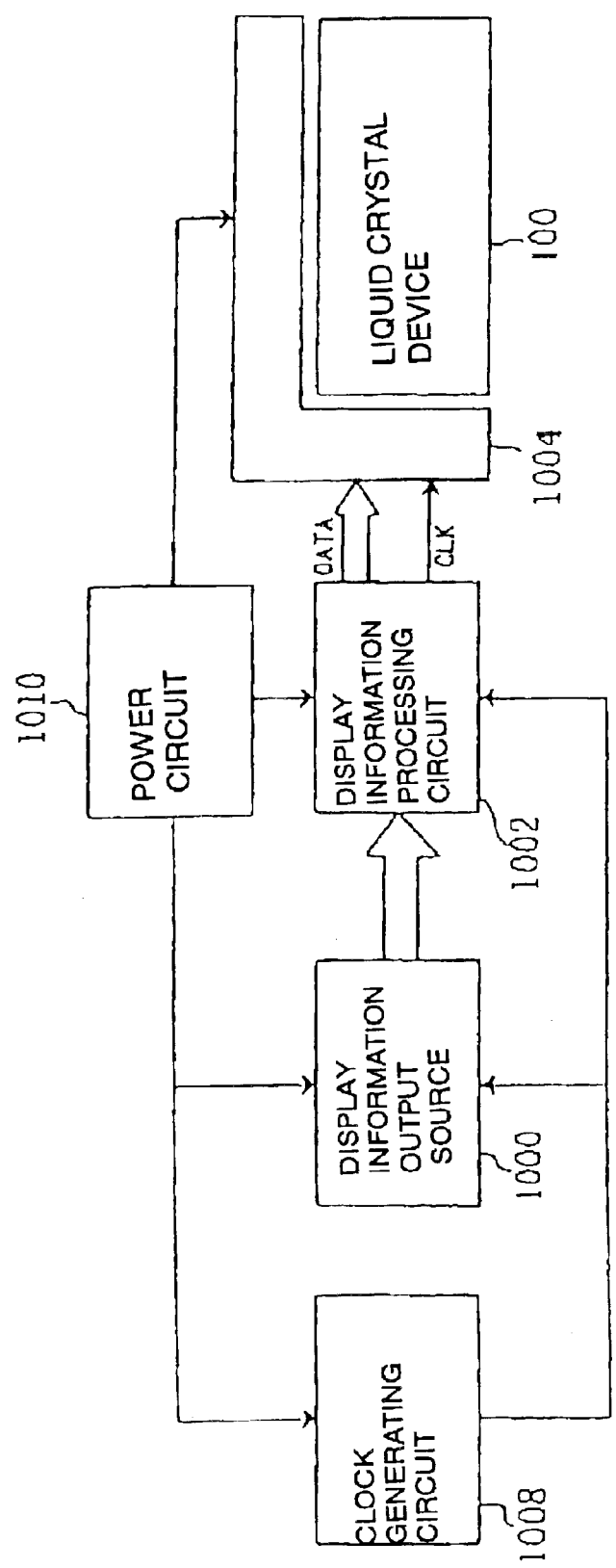
FIG. 10 is a schematic showing a circuit configuration for a light bulb in a projection-type color display apparatus in an embodiment of an electronic apparatus of the invention.
Figure 11:
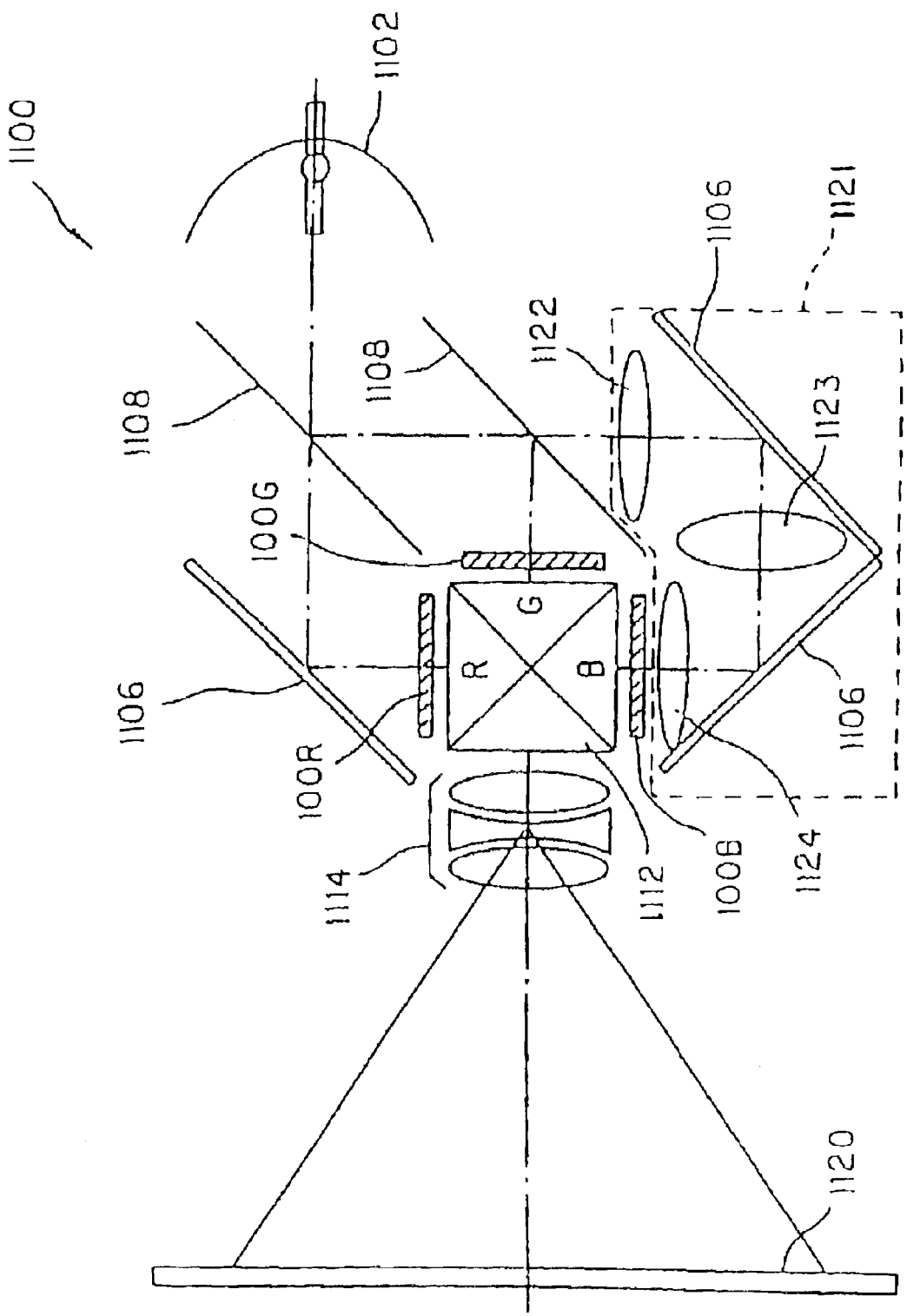
FIG. 11 is a schematic showing a color liquid-crystal projector as an example of a projection-type color display apparatus in an embodiment of an electronic apparatus of the invention.

Next, an explanation is provided regarding an embodiment of a projection-type color display apparatus as one example of an electronic apparatus using, as a light bulb, the electrooptical apparatus explained in detail above, with reference to FIGS. 10 and 11.

First, an explanation is provided regarding a circuit configuration of a projection-type color display apparatus of this embodiment, with reference to FIG. 10. FIG. 10 is a schematic that shows a circuit configuration on one of the three light bulbs in the projection-type color display apparatus. Because the three light bulbs basically have the same configuration, explanation is provided regarding a part of one of a circuit configuration. The three light bulbs are different in input signals (i.e., driven on signals respectively for R, G and B). Furthermore, the circuit configuration on a G light bulb is different as compared to the cases with R and B, in that the image signal is reversed in order within each field or frame or in a horizontal or vertical scanning direction, such that an image is display with inversion.

In FIG. 10, the projection-type color display apparatus is structured with a display information output source 1000, a display information processing circuit 1002, a drive circuit 1004, a liquid crystal device 100, a clock generating circuit 1008 and a power source circuit 1010. The display information output source 1000 includes forms of memory, such as a ROM (Read Only Memory), a RAM (Random Access Memory) and an optical disk device, and a tuning circuit to tune and output an image signal, to output display information, such as an image signal of predetermined format to the display information processing circuit 1002 in response to a clock signal from the clock generating circuit 1008. The display information processing circuit 1002 is configured including various well-known processing circuits, such as an amplifying/polarity-inverting circuit, a phase developing circuit, a rotation circuit, a gamma-correction circuit and a clamp circuit, to sequentially generate a digital signal from display information inputted based on a clock signal, and output the signal together with a clock signal CLK to the drive circuit 1004. The drive circuit 1004 drives the liquid crystal device 100. The power source circuit 1010 supplies a predetermined power to the foregoing circuits. A drive circuit 1004 and a display information processing circuit 1002 can be mounted on the TFT array substrate structuring the liquid-crystal device 100.

Next, referring to FIG. 11, an explanation is provided regarding the overall structure, particularly the optical structure, of the projection-type color display apparatus of this embodiment. Herein, FIG. 11 is a schematic of the projection-type color display apparatus.

In FIG. 11, the liquid crystal projector 1100, as an example of a projection-type color display apparatus of the embodiment, is structured as a projector using, as RGB light bulbs 100R, 100G and 100B, three respective liquid crystal modules, each including a liquid crystal device 100 mounting the foregoing drive circuit 1004 on the TFT array substrate. In the liquid crystal projector 1100, where projection light is emitted from white-light source lamp unit 1102, such as a metal halide lamp, the projection light is separated into light components R, G, B corresponding to the three primary colors RGB by three mirrors 1106 and two dichroic mirrors 1108. The light components are respectively guided to the light bulbs 100R, 100G and 100B corresponding to the colors. On this occasion, particularly, light B is guided through a relay lens system 1121 including an incident lens 1122, a relay lens 1123 and an emission lens 1124 in order to prevent optical loss due to a long optical path. The optical components corresponding to primary colors respectively modulated by the light bulbs 100R, 100G and 100B are re-combined by a dichroic prism 1112, and then projected as a color image onto a screen 1120 through a projection lens 1114.

(Manufacturing Method for Substrate Device)

Figure 12:
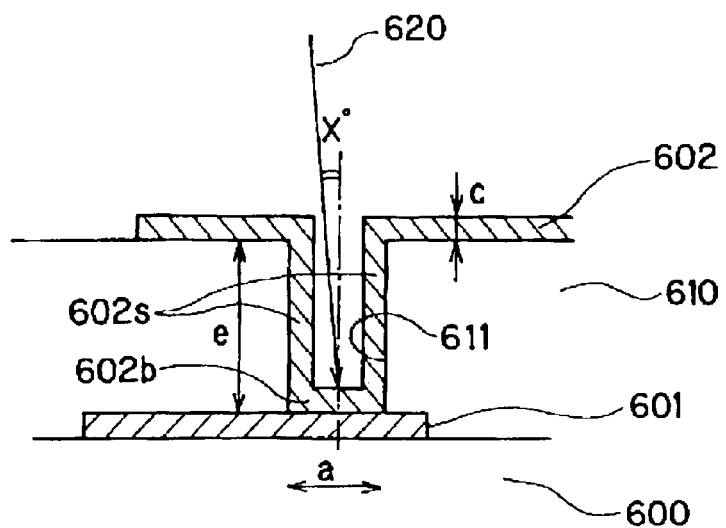
FIG. 12 is a sectional view showing the form in the vicinity of a contact hole of the substrate device.
Figure 13:
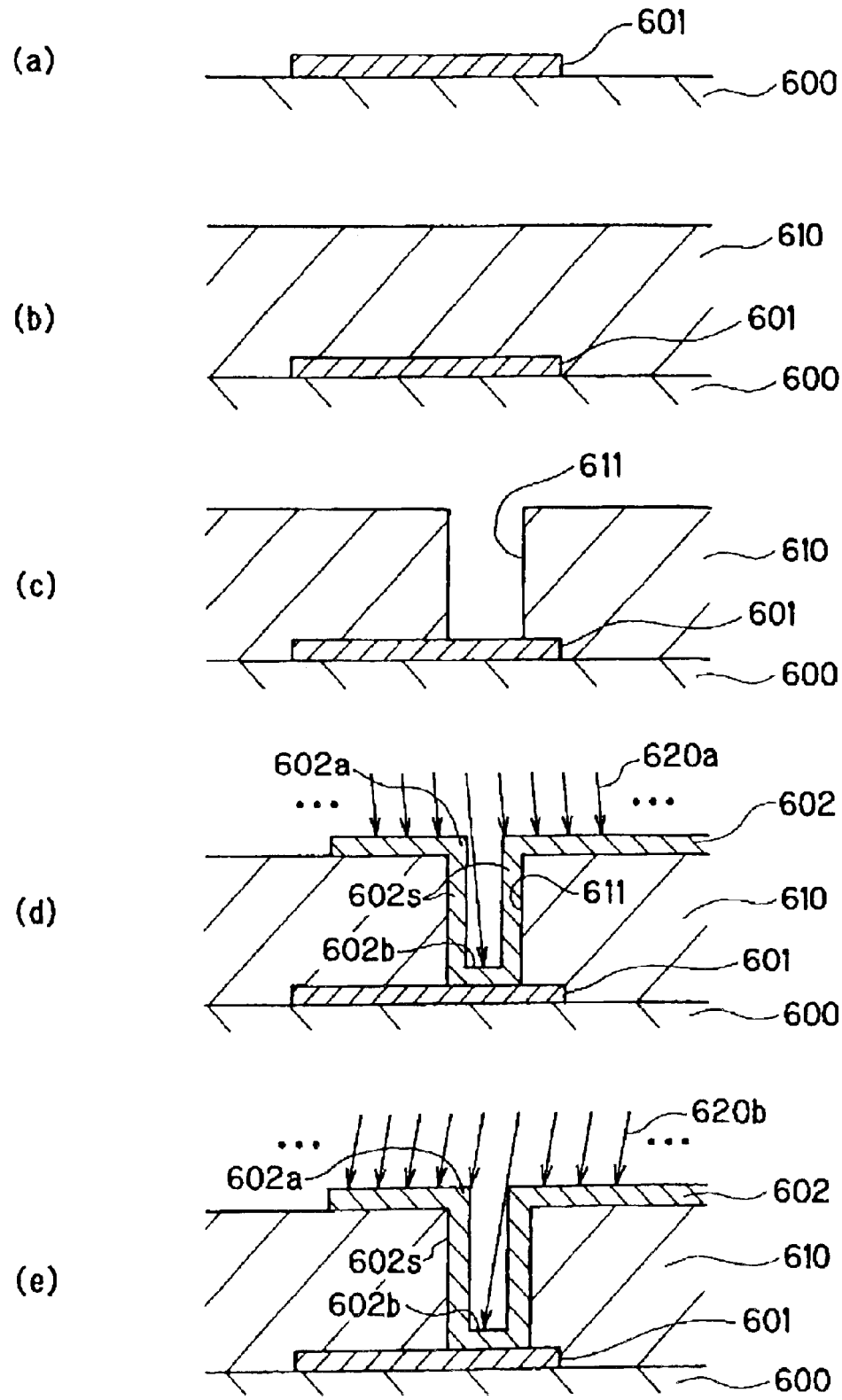
FIGS. 13(a)–13(e) are sectional views showing, in the section corresponding to FIG. 12, a manufacturing method for a substrate device.
Figure 14:
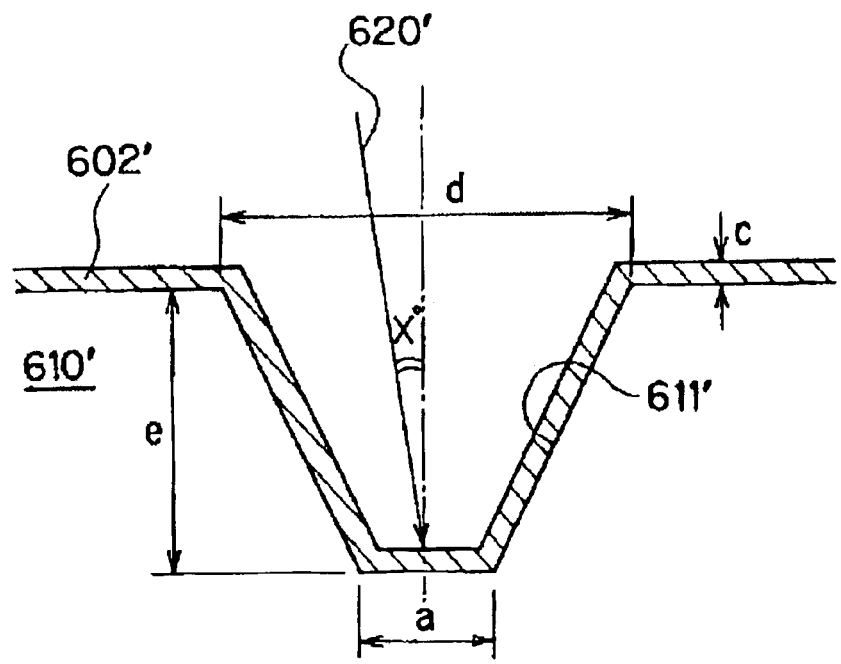
FIG. 14 is a sectional view showing another specific example of a contact-hole shape.
Figure 15:
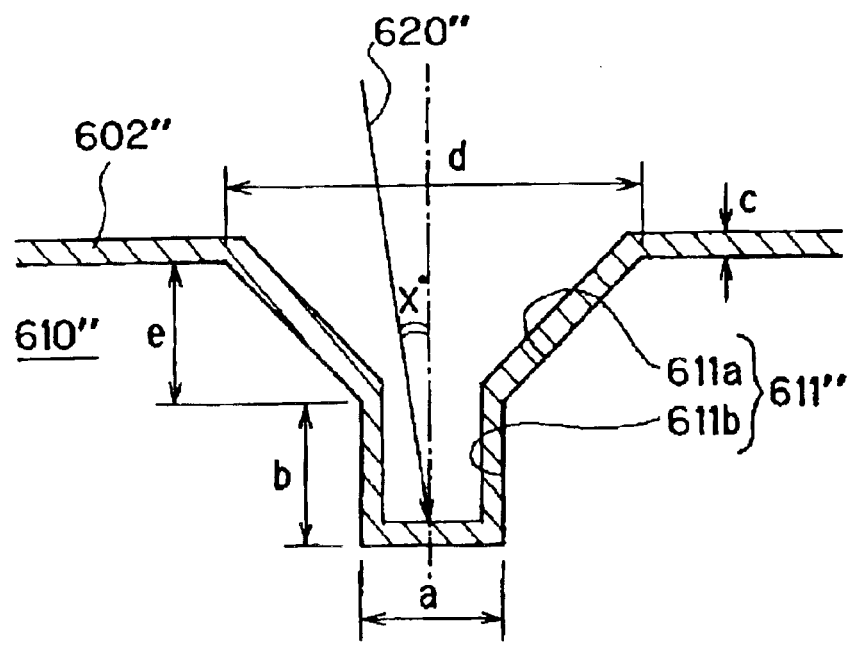
FIG. 15 is a sectional view showing still another specific example of a contact-hole shape.

Next, an explanation is provided regarding an embodiment for a manufacturing method for a substrate device to be suitably used in the electrooptical apparatus of the foregoing embodiment, with reference to FIGS. 12 to 15. Herein, FIG. 12 is a sectional view showing the form in the vicinity of a contact hole of a substrate device. FIGS. 13(a)–13(e) are sectional views showing, in the sections corresponding to FIG. 12, a manufacturing method for a substrate device. FIG. 14 and FIG. 15 are each sectional views showing other specific examples of contact-hole forms.

As shown in FIG. 12, this embodiment concerns a process of forming, on a substrate 600 of the substrate device, a second conductor layer 602 having a predetermined planar pattern through an interlayer insulating film 610 on a first conductor layer 601 having a predetermined planar pattern, and electrically connecting the two conductor films through a contact hole 611 opened in the interlayer insulating film 610.

In FIG. 12, a contact hole 611 as one example of a "hole" in the invention is opened through the interlayer insulating film 610. The contact hole 611 is in a pillar form, such as an angular or circular form having a planar form of a square, rectangle or polygon.

In FIG. 12, an ion path 620 denoted by the arrow shows a path of the ions to be implanted upon reducing the resistance of the second conductor layer 602 by an ion-implant process. In the embodiment, particularly the ion path 620 is inclined by a predetermined angle X with respect to a centerline of the contact hole 611.

In the embodiment, particularly the predetermined angle X is set to satisfy $0<X\leq\tan^{-1}\{(a-2c)/2e\}$ where the diameter of the contact hole 611 is "a", the depth of the contact hole 611 is "e", and the film thickness of the second conductor layer is "c". Herein, because the predetermined angle X is set such that $0<X$, ions can be implanted to a second conductor layer region 602s formed on a side surface of the contact hole 611. Moreover, setting is to satisfy $X\leq\tan^{-1}\{(a-2c)/2e\}$, accordingly, ions can be implanted also to a center of a second conductor layer region 602b formed on a bottom surface in the contact hole 611.

Namely, in a state shown in FIG. 12, ion implantation is possible to the second conductor layer region 602s formed on the right side surface of the contact hole 611. Ion implantation is also simultaneously possible to the second conductor layer region 602b formed in the right half of the bottom surface of the contact hole 611. If the ion path 620 in its inclination is inverted left and right with reference to that state, it becomes possible to implant ions to the second conductor layer region 602s formed on the left side surface of the contact hole 611, and simultaneously to the second conductor layer region 602b formed in the left half of the bottom surface of the contact hole 611. Furthermore, if the ion path 620 is inclined in four directions, including the direction that is perpendicular to the page in FIG. 12, ion implantation is made possible to the second conductor layer region 602s formed on all the side surface of the contact hole 611 and simultaneous to the second conductor layer region 602b formed in all the bottom surface of the contact hole 611. In this manner, by properly changing the inclination direction of the ion path 620 in the ion-implant process, for example, to directions of three, four, eight or all surrounding the center of the contact hole 611, it is made possible to provide an ion-implant region to the entire bottom and side surfaces in the contact hole 611.

Next, an explanation is provided regarding a manufacturing method for a substrate device including a structure as shown in FIG. 12, following the sectional views of FIGS. 13(a)–13(e).

As shown in FIG. 13(a), a first conductor layer 601 is first formed of doped silicon or the like on the substrate 600. After forming a conductor layer over the entire surface of the substrate 600, e.g., by CVD process, sputtering process, bonding process or the like, this is patterned by photolithography, etching or the like to form a predetermined pattern of a first conductor layer 601. Otherwise, the first conductor layer 601 may be formed by reducing the resistance in a part of a semiconductor layer, such as a single-crystal silicon film or polysilicon film, by ion implantation or the like.

Next, as shown in FIG. 13(b), an interlayer insulating film 610 is formed over the entire surface of the substrate 600 on which is formed the first conductor layer 601. Herein, an interlayer insulating film 610 is formed by a silicate glass film, a silicon nitride film or a silicon oxide film, such as of NSG, PSG, BSG or BPSG, by the use, e.g., of an atmospheric or low-pressure CVD process or TEOS gas.

Next, as shown in FIG. 13(c), a contact hole 611 is opened in the interlayer insulating film 610. Herein, a pillar-like contact hole 611 having a side surface that is perpendicular to the substrate surface is opened by using, for example, a dry etching having high directivity. At this time, other contact holes can also be opened in the other regions of the substrate 600.

Next, as shown in FIG. 13(d), a material film, e.g., of polysilicon, to be formed into a second conductor layer 602, is formed on the insulating film 610 in which is opened the contact hole 611, by a CVD process, a sputtering process or the like. Subsequently, ions are implanted to the material film by an ion-implant process to reduce the resistance thereof in the timing at or around the patterning on the material film, along an implant path shown by the ion path 620a. For example, where the diameter "a", of the contact hole 611 shown in FIG. 12 is 1000 nm (nanometers), the depth "e", of the contact hole 611 is 400 nm, and the film thickness "c", of the second conductor layer 602 is 150 nm, a favorable conductivity is obtained without unevenness in the second conductor layer 602, by implanting B (boron) at an acceleration of 25 Kev with a dose at a comparatively high concentration of approximately $10^{15}/cm^2$ using a diborane gas.

The material film for the second conductor layer 602 may use a non-doped silicon film or a doped silicon film introduced with ions upon deposition. In the latter case, a second conductor layer 602 can be formed having a further reduced resistance or desired resistance value by the ion-implant process. Meanwhile, the ion to be implanted is properly selected depending upon the kind of material film and whether the first conductor layer 601 is a P$^+$ type or N$^+$ type, where P (phosphorus) or the like is satisfactory without limitation to B.

As noted above, the embodiment particularly implants ions with inclination by a predetermined angle X in the ion-implant process. As a result, in FIG. 13(d), ions can be implanted to the second conductor layer region 602s formed on the right side surface of the contact hole 611, and to the second conductor layer region 602b formed in the right half of the bottom surface thereof. On this occasion, however, because the second conductor layer region 602a formed in the opening edge of the contact hole 611 reduces or prevents a part of the ion path 620a, ion implantation is impossible, in FIG. 13(d), to the second conductor layer region 602s formed on the left side surface of the contact hole 611, and to the second conductor layer region 602b formed in the left half of the bottom surface.

For this reason, as shown in FIG. 13(e), the inclination of ion implantation is changed to continue the ion-implant process. This makes it possible to implant ions to the second conductor layer region 602s formed on the left side surface of the contact hole 611, and to the second conductor layer region 602b formed in the bottom-surface left half. Similarly, by changing the inclination of ion implantation to continue the ion-implant process, it is possible to form a second conductor layer region 602s on the entire side surface of the contact hole 611, and a second conductor layer region 602b in the entire bottom surface.

As described above, the manufacturing method of the invention can comparatively easily reduce the resistance of the material film at the inside of the contact hole 611 to thereby form a second conductor layer 602. As a result, the first conductor layer 601 and the second conductor layer 602 can be electrically connected together through the contact hole 611. It is therefore possible to architect on a substrate 600 an electronic device or electronic circuit including the first conductor layer 601 and the second conductor layer 602.

In this manufacturing method, dry etching is used in the process of FIG. 13(c) to open a pillar-like contact hole 611. However, as shown in FIG. 14, an inverted circular or pyramidal cone-shaped contact hole 611' may be formed on the substrate by the use of wet etching. Otherwise, as shown in FIG. 15, by using wet etching and dry etching in combination in this order, a contact hole 611" may be opened on the substrate which has an inverted circular or pyramidal cone-shaped first contact hole portion 611a and a pillar-like second contact hole portion 611b.

In the case of FIG. 14, particularly the predetermined angle X to incline the ion path 620' in the ion-implant process as shown in FIGS. 13(d) and 13(e) is set to satisfy $0 \leq X \leq \tan^{-1}\{(d-a)/2e\}$, where the bottom-surface diameter of the contact hole 611' is "a", the diameter at the opening edge of the contact hole 611' is "d", the depth of the contact hole 611' is "e", and the film thickness of the second conductor layer 602' is "c". In this manner, because the predetermined angle X is set $0 \leq X$, ions can be implanted to the material film region formed on the side surface of the contact hole 611'. Particularly, because there is an inclination in the side surface of the contact hole 611', even if X=0, ions cain be implanted to the material film region formed on the side surface of the contact hole 611' correspondingly to the degree thereof. Moreover, because $X \leq \tan^{-1}\{(d-a)/2e\}$ is satisfied, ions can even be implanted to the center of the bottom surface of the contact hole 611'. Accordingly, by providing a plurality of inclination directions of ion implantation similarly to the case explained with reference to FIGS. 13(d) and 13(e), ions can be implanted to almost all, or the entirety of, the bottom and side surfaces of the contact hole 611'.

In the case of this concrete example, where for example the diameter "a", in the bottom surface of the contact hole 611' is 1000 nm, the diameter "d", at the opening edge of the contact hole 611' is 3000 nm, the depth "e", of the contact hole 611' is 400 nm, and the film thickness "c", of the second conductor layer 602' is 150 nm, a favorable conductivity is obtained without unevenness in the second conductor layer 602', by implanting B at an acceleration of approximately 25 Kev, with a dose at a comparatively high concentration of approximately $10^{15}/cm^2$ by using a diborane gas.

In the case of FIG. 15, particularly the predetermined angle X to incline the ion path 620" in the ion-implant process, as shown in FIGS. 13(*d*) and 13(*e*), is set to satisfy $0<X\leq\tan^{-1}(a-2c)/2(c \sin Y+b-c)$, where the diameter of the second contact hole portion 611*b* is "a", the diameter at the opening edge of the first contact hole portion 611*a* is "d", the depth of the first contact hole portion 611*a* is "e", the depth of the second contact hole portion 611*b* is "b", and the film thickness of the second conductor layer 602" is "c" (where $Y=\tan^{-1}\{(d-a)/2e\}$). In this manner, because the predetermined angle X is set 0<X, ions can be implanted to the material film region formed on the side surface of the first contact hole portion 611*a* and second contact hole portion 611*b*. Moreover, because $X \leq \tan^{-1}(a-2c)/2(c \sin Y+b-c)$ is satisfied, ions can also be implanted to the bottom-surface center in the contact hole 611*b*. Accordingly, by providing a plurality of inclination directions of ion implantation similarly to the case explained with reference to FIGS. 13(*d*) and 13(*e*), ions can be implanted to almost all or the entirety of, the bottom and side surfaces of the contact hole 611".

In the case of this concrete example, where for example the diameter "a", of the second contact hole portion 611*b* is 1000 nm, the diameter "d", at the opening edge of the first contact hole portion 611*a* is 3000 nm, the depth "e", of the first contact hole portion 611*a* is 400 nm, the depth "b", of the second contact hole portion 611*b* is 400 nm, and the film thickness "c", of the second conductor layer 602" is 150 nm, a favorable conductivity is obtained without unevenness in the second conductor layer 602", by implanting B at an acceleration of approximately 25 Kev, with a dose at a comparatively high concentration of approximately $10^{15}/cm^2$ by using a diborane gas.

The manufacturing method for a substrate device, explained above with reference to FIGS. 12 to 15, is also applicable to a manufacturing method for an electrooptical apparatus including the process to connect the drain electrode 302 to the high-concentration drain region 1*e* of the semiconductor layer 1*a*, or the process to contact the source electrode 303 to the high-concentration source region id of the semiconductor layer 1*a*, as shown in FIGS. 1 and 8. In this case, manufacturing may be performed by placing the drain electrode 302, or source electrode 303 explained with reference to FIGS. 1 to 9, to correspond to the second conductor layer 602, and the semiconductor layer 1*a* explained with reference to FIGS. 1 to 9 to correspond to the first conductor layer 601.

The present invention is not limited to the foregoing embodiments but can be modified within a scope not countering to the gist or idea of the invention to be read from the entire claim and description, to include such modified electrooptical substrate device and manufacturing method for same, electrooptical apparatus, electronic apparatus and manufacturing method for a substrate device within the technical scope of the invention.

What is claimed is:

1. A method for manufacturing an electrooptical substrate device that includes a substrate, an insulator layer, a semiconductor layer formed above said insulator layer and including source region, drain region, and a channel region, a gate electrode formed above said semiconductor layer in said channel region through a gate insulating film, a scanning line connected to said gate electrode, a data line connected to one of said source region and said drain region, a pixel electrode connected to the other of said source region and said drain region, a transistor being architected by said semiconductor layer, said gate insulating film and said gate electrode to switch-control said pixel electrode, an interlayer insulating film formed above said gate electrode, a source electrode formed by conductor layer above said interlayer insulating film and connected to said source region, a drain electrode formed by conductor layer above said interlayer insulating film and connected to said drain region, said data line being connected to one of said source region and said drain region by way of connecting one of said source electrode and said drain electrode, and said pixel electrode being connected to the other of said source region and said drain region by way of connecting the other of said source electrode and said drain electrode, the method comprising:

connecting said source electrode to said source region through a contact hole opened in said interlayer insulating film and said gate insulating film, and said drain electrode being connected to said drain region through a contact hole opened in said interlayer insulating film and said gate insulating film;

forming said interlayer insulating film above said semiconductor layer via a first depositing step;

opening said contact hole in said interlayer insulating film and said gate insulating film;

forming a material film of a predetermined kind to be formed into said conductor layer, above said interlayer insulating film where the contact hole is opened via a second depositing step; and implanting ions to said formed material film to thereby form said conductor layer, said ions being implanted with an inclination by a predetermined angle X with respect to a centerline of said contact hole, such that said ions are implanted to a region of said material film formed on a side surface of said contact hole, and said predetermined angle X being set within a range that the ions are implanted at the whole region of said material film formed on a bottom surface of said contact hole by changing the inclination direction of the ions; and in the opening step, said contact hole being opened in a pillar form, said predetermined angle X in the ion implant step being set to satisfy $0<X\leq\tan^{-1}\{(a-2c)/2e\}$, where a diameter of said contact hole is "a", a depth of said contact hole is "e", and a film thickness of said material film is "c".

2. A method for manufacturing an electrooptical substrate device that includes a substrate, an insulator layer, a semiconductor layer formed above said insulator layer and including a source region, a drain region and a channel region, a gate electrode formed above said semiconductor layer in said channel region through a gate insulating film, a scanning line connected to said gate electrode, a data line connected to one of said source region and said drain region, a pixel electrode connected to the other of said source region and said drain region, a transistor being architected by said semiconductor layer, said gate insulating film and said gate electrode to switch-control said pixel electrode an interlayer insulating film formed above said gate electrode, a source electrode formed by a conductor layer above said interlayer insulating film and connected to said source region, a drain electrode formed by a conductor layer above said interlayer insulating film and connected to said drain region, said data line being connected to one of said source region and said drain region by way of connecting one of said source electrode and said drain electrode, and said pixel electrode being connected to the other of said source region and said drain region by way of connecting the other of said source electrode and said drain electrode, the method comprising:

connecting said source electrode to said source region through a contact hole opened in said interlayer insulating film and said gate insulating film, and said drain electrode being connected to said drain region through a contact hole opened ins aid interlayer insulating film and said gate insulating film;

forming said interlayer insulating film above said semiconductor layer via a first depositing step;

opening said contact hole in said interlayer insulating film and said gate insulating film;

forming a material film of a predetermined kind to be formed into said conductor layer, above said interlayer insulating film where the contact hole is opened via a second depositing step; and implanting ions to said formed material film to thereby form said conductor layer, said ions being implanted with an inclination by a predetermined angle X with respect to a centerline of said contact hole, such that said ions are implanted to a region of said material film formed on a side surface of said contact hole, and said predetermined angle X being set within a range that the ions are implanted at the whole region of said material film formed on a bottom surface of said contact hole by changing the inclination direction of the ions; and in the opening step, said contact hole being opened in a circular or pyramidal cone form broadening in a direction from said interlayer insulating film toward said conductor layer, and said predetermined angle X in the ion implant step being set to satisfy $0 \leq X \leq \tan^{-1}\{(d-a)/2e\}$, where a diameter of a bottom face of the contact hole is "a", a diameter at an opening edge of said contact hole is "d", a depth of said contact hole is "e", and a film thickness of said material film is "c".

3. A method for manufacturing an electrooptical substrate device that includes a substrate, an insulator layer, a semiconductor layer formed above said insulator layer and including a source region, a drain region and a channel region, a gate electrode formed above said semiconductor layer in said channel region through a gate insulating film, a scanning line connected to said gate electrode, a data line connected to one of said source region and said drain region, a pixel electrode connected to the other of said source region and said drain region, a transistor being architected by said semiconductor layer, said gate insulating film and said gate electrode to switch control said pixel electrode, an interlayer insulating film formed above said gate electrode, a source electrode formed by a conductor layer above said interlayer insulating film and connected to said source region, a drain electrode formed by a conductor layer above said interlayer insulating film and connected to said drain region, said date line being connected to one of said source region and said drain region by way of connecting one of said source electrode and said drain electrode, and said pixel electrode being connected to the other of said source region and said drain region by way of connecting the other of said source electrode and said drain electrode, the method comprising:

connecting said source electrode to said source region through a contact hole opened in said interlayer, insulating film, and said drain electrode being connected to said drain region through a contact hole opened in said interlayer insulating film;

forming said interlayer insulating film above said semiconductor layer via a first depositing step;

opening said contact hole in said interlayer insulating film;

forming a material film of a predetermined kind to be formed into said conductor layer, above said interlayer insulating film where the contact hole is opened via a second depositing step; and implanting ions to said formed material film to thereby form said conductor layer, said ions being implanted with an inclination by a predetermined angle X with respect to a centerline of said contact hole, such that said ions are implanted to a region of said material film formed on a side surface of said contact hole, and said predetermined angle X being set within a range that the ions are implanted at the whole region of said material film formed on a bottom surface of said contact hole by changing the inclination direction of the ions; and in the opening step, said contact hole being opened having a first contact hole portion opened in a circular or pyramidal cone form broadening in a direction from said interlayer insulating film toward said conductor layer, and a second contact hole portion opened in a pillar form continuing from a bottom of the first portion, and said predetermined angle X in the ion implant step being set to satisfy $0 < X \leq \tan^{-1}(a-2c)/2(c \sin Y + b - c)$, where $Y = \tan^{-1}\{(d-a)/2e\}$, where a diameter of said second contact hole portion is "a", a diameter at an opening edge of said first contact hole portion is "d", a depth of said first contact hole portion is "e", a depth of said second contact hole portion is "b", and a film thickness of said material film is "C".

* * * * *